(12) United States Patent
Notani et al.

(10) Patent No.: US 6,396,888 B1
(45) Date of Patent: May 28, 2002

(54) DIGITAL DATA TRANSMISSION SYSTEM

(75) Inventors: Hiromi Notani; Harufusa Kondoh; Masahiko Ishiwaki; Tsutomu Yoshimura, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/032,944

(22) Filed: Mar. 2, 1998

(30) Foreign Application Priority Data

Aug. 28, 1997 (JP) .......................................... P09-232459

(51) Int. Cl.[7] ................................................ H04L 7/06
(52) U.S. Cl. ....................... 375/364; 375/365; 375/376; 370/514
(58) Field of Search .............................. 375/354, 362, 375/364, 365, 376, 358, 373, 374, 375; 370/509, 514

(56) References Cited

U.S. PATENT DOCUMENTS

| | | | | |
|---|---|---|---|---|
| 4,949,339 A | * | 8/1990 | Shimada et al. | 370/112 |
| 4,965,884 A | * | 10/1990 | Okura et al. | 375/106 |
| 4,993,026 A | * | 2/1991 | Yamashita | 370/100 |
| 5,175,734 A | * | 12/1992 | Sarkoezi | 370/100 |
| 5,276,709 A | * | 1/1994 | Kazawa et al. | 375/25 |
| 5,313,500 A | * | 5/1994 | Rikiyama | 375/114 |
| 5,481,547 A | * | 1/1996 | Sasaki et al. | 370/112 |
| 5,574,752 A | * | 11/1996 | Juri | 375/354 |
| 5,602,884 A | * | 2/1997 | Wieczorkiewicz et al. | 375/376 |

OTHER PUBLICATIONS

Ohtomo, et al., "A 40Gb/s 8×8 ATM Switch LSI using 0.25μm CMOS/SIMOX," IEEE International Solid–State Circuits Conference, Digest of Techinal Papers, Feb. 7, 1997, pp. 154–155.

* cited by examiner

Primary Examiner—Stephen Chin
Assistant Examiner—Dac V. Ha
(74) Attorney, Agent, or Firm—Burns, Doane, Swecker & Mathis, LLP

(57) ABSTRACT

A digital data transmission system for transmitting digital data, a frame pulse signal, and a clock using a required minimum number of signal lines and with a simple circuit structure is provided. A signal separation circuit (46) that receives a multiple clock (CKFP) which is a frame pulse signal (FP) multiplexed with a clock (CK) includes a clock recovery circuit (47) for reproducing a recovered clock (RCK) by synchronization with the multiple clock (CKFP) using a synchronization loop, and a frame pulse signal separation circuit (48) for separating a recovered frame pulse signal (RFP) from the multiple clock (CKFP) on the basis of the recovered clock (RCK).

31 Claims, 18 Drawing Sheets

DIGITAL DATA TRANSMISSION SYSTEM

BACKGROUND OF THE INVENTION

1. Field of the Invention

The present invention relates to a digital data transmission system and, more particularly, to a method of transmitting a frame pulse signal in parallel with data principally within a device in a communication system using frames, packets, and the like.

2. Description of the Background Art

For frame synchronization, conventional frame synchronization type digital data communication systems have employed two methods: a first method wherein a transmitter transmits data in which a frame pattern is embedded and a receiver detects a frame pulse signal from the data, and a second method wherein a transmitter transmits a frame pulse signal in parallel with data.

In general, the first method is employed for data transmission between devices, and the second method is employed for data transmission within a device. In some cases, for bit synchronization with data to be received, the receiver comprises a clock recovery circuit and the transmitter also transmits a clock in parallel with data.

FIG. 31 is a block diagram showing the transmission of a frame pulse signal and a clock in parallel with digital data. As shown, a transmitting portion 39 transmits data DA, a frame pulse signal FP, and a clock CK from drivers 33 to 35 provided therein through transmission lines 51 to 53 respectively to a receiving portion 49. In FIG. 31, the reference numerals 31 and 32 designate flip-flops for processing the data DA and the frame pulse signal FP. The transmission lines 51 to 53 are formed by wires, cables, printed wiring, and the like.

The receiving portion 49 comprises drivers 43 to 45 for receiving the data DA, the frame pulse signal FP, and the clock CK through the transmission lines 51 to 53, and flip-flops 41 and 42 operating in synchronism with the clock CK for performing signal processing based on the data DA and the frame pulse signal FP. Examples of the clock CK, the frame pulse signal FP and the data DA are shown in FIG. 32.

The receiving portion 49 is provided for each board corresponding to one or more transmitting LSI circuits of a transmitter.

The digital data transmission system which contains a plurality of lines like a switching system in the above described manner to transmit the data, the frame pulse signal, and the clock in parallel in opposite directions for each line is disadvantageous in that the number of input/output pins of an interface LSI circuit or the number of input/output connectors of a board limit the number of lines to be contained in the digital data transmission system.

FIG. 33 illustrates the connection between N interface LSI circuits 61 to 6N (where N is a natural number) and a single N×N switch LSI circuit 60. As shown, since each of the interface LSI circuits 61 to 6N has six pins for transmitting and receiving the data DA, the frame pulse signal FP, and the clock CK, the switch LSI circuit 60 needs 6·N input/output pins. The interface LSI circuits 61 to 6N comprise 3-bit output buffer groups G21 to G2N, and 3-bit input buffer groups G31 to G3N, respectively. The switch LSI circuit 60 comprises 3bit output buffer groups G41 to G4N, and 3-bit input buffer groups G51 to G5N.

M-bit parallel transmission/reception of the data DA requires 2(2+M) input/output pins in each of the interface LSI circuits and accordingly requires 2(2+M)·N pins in the switch LSI circuit 60. Since the switch LSI circuit 60 requires additional pins for a control signal, the number of lines to be contained in the digital data transmission system (the number of connectable interface LSI circuits) is limited due to the shortage of pins.

The conventional digital data transmission system constructed as above described has required a great number of signal lines when the system must transmit the digital data, the frame pulse signal, and the clock.

Additionally, the frame pulse signal has been multiplexed with the digital data heretofore. However, because of the irregularity of the digital data, much time and high costs are required for the multiplexing of signals in a transmitter and the separation of the signals in a receiver.

SUMMARY OF THE INVENTION

A first aspect of the present invention is intended for a digital data transmission system for transmitting digital data in a frame synchronization manner. According to the present invention, the digital data transmission system comprises a transmitting portion for transmitting digital data, and a receiving portion for receiving the digital data, the transmitting portion comprising a clock multiplexing circuit for multiplexing a frame pulse signal for frame synchronization with a clock having a predetermined period to output a multiple clock to the receiving portion, the receiving portion comprising a clock recovery circuit for reproducing the clock from the multiple clock to provide a recovered clock by using a synchronization loop circuit for synchronizing a reference signal associated with the multiple clock and a comparison output signal, and a frame pulse signal separation circuit for separating the frame pulse signal from the multiple clock to provide a recovered frame pulse signal by using the recovered clock.

Preferably, according to a second aspect of the present invention, in the digital data transmission system of the first aspect, the clock multiplexing circuit includes clock shaping means receiving the clock and the frame pulse signal, the clock shaping means for performing a shaping process of masking the clock at a fixed value at least for the predetermined period during the time the frame pulse signal is active, the clock shaping means for outputting the clock intactly as the multiple clock for other time periods.

Preferably, according to a third aspect of the present invention, in the digital data transmission system of the second aspect, the clock shaping means further receives an enable signal and includes enabling means for disabling the shaping process to force the clock to be outputted intactly as the multiple clock when the enable signal is inactive.

Preferably, according to a fourth aspect of the present invention, in the digital data transmission system of the second aspect, the clock recovery circuit includes: phase comparing means for making a comparison between the phase of the multiple clock and the phase of the recovered clock, control signal output means for outputting a control signal on the basis of a result of the phase comparison of the phase comparing means, and oscillating means for generating the recovered clock at an oscillation frequency based on the control signal, the phase comparing means, the control signal output means, and the oscillating means constituting a PLL circuit for performing a phase synchronization process on the multiple clock and the recovered clock, the synchronization loop circuit including the PLL circuit, the reference signal including the multiple clock, the comparison output signal including the recovered clock.

Preferably, according to a fifth aspect of the present invention, in the digital data transmission system of the fourth aspect, the clock recovery circuit further includes masking means receiving the recovered frame pulse signal, the masking means for disabling the phase synchronization when the recovered frame pulse signal indicates an active state.

Preferably, according to a sixth aspect of the present invention, in the digital data transmission system of the fourth aspect, the clock recovery circuit further includes synchronization detecting means for detecting whether or not the multiple clock and the recovered clock is in synchronism with each other to disable the phase synchronization process upon detection of synchronization.

Preferably, according to a seventh aspect of the present invention, in the digital data transmission system of the second aspect, the clock recovery circuit includes: phase comparing means for making a comparison between the phase of the multiple clock and the phase of a delayed multiple clock, control signal output means for outputting a control signal on the basis of a result of the phase comparison of the phase comparing means, and variable delay means for providing a time delay of n times the predetermined period (where n is a natural number) to the multiple clock on the basis of the control signal to output the delayed multiple clock, the phase comparing means, the control signal output means, and the variable delay means constituting a DLL circuit for performing a delay synchronization process on the multiple clock and the delayed multiple clock, the synchronization loop circuit including the DLL circuit, the reference signal including the multiple clock, the comparison output signal including the delayed multiple clock, and the clock recovery circuit further includes logical OR means for ORing the multiple clock and the delayed multiple clock to output the recovered clock.

Preferably, according to an eighth aspect of the present invention, in the digital data transmission system of the second aspect, the clock recovery circuit includes: phase comparing means for making a comparison between the phase of a system clock independent of the multiple clock and the phase of an oscillation signal, control signal output means for outputting a control signal on the basis of a result of the phase comparison of the phase comparing means, oscillating means for generating the oscillation signal at an oscillation frequency based on the control signal, and variable delay means for providing a time delay of the predetermined period to the multiple clock on the basis of the control signal to output a delayed multiple clock, the phase comparing means, the control signal output means, and the oscillating means constituting a PLL circuit for performing a phase synchronization process on the system clock and the oscillation signal, the synchronization loop circuit including the PLL circuit, the reference signal including the system clock, the comparison output signal including the oscillation signal, and the clock recovery circuit further includes logical OR means for ORing the multiple clock and the delayed multiple clock to output the recovered clock.

Preferably, according to a ninth aspect of the present invention, in the digital data transmission system of the second aspect, the frame pulse signal separation circuit includes fixed value detecting means for detecting whether or not the multiple clock maintains the fixed value for the predetermined period to output the recovered frame pulse signal which is active when the multiple clock maintains the fixed value for the predetermined period and is inactive otherwise.

Preferably, according to a tenth aspect of the present invention, in the digital data transmission system of the first aspect, the clock multiplexing circuit includes clock shaping means receiving the clock and the frame pulse signal, the clock shaping means for performing a shaping process of doubling the predetermined period of the clock to output the multiple clock during the time the frame pulse signal is active.

Preferably, according to an eleventh aspect of the present invention, in the digital data transmission system of the tenth aspect, the clock recovery circuit includes: phase comparing means receiving the earliest and second earliest ones of the multiple clock, a first delayed multiple clock, and a second delayed multiple clock respectively as first and second comparison signals for making a comparison between the phases of the first and second comparison signals, control signal output means for outputting a control signal on the basis of a result of the phase comparison of the phase comparing means, first variable delay means for providing a time delay of n times the predetermined period (where n is a natural number) to the multiple clock on the basis of the control signal to output the first delayed multiple clock, and second variable delay means for providing a time delay of n times the predetermined period to the first delayed multiple clock on the basis of the control signal to output the second delayed multiple clock, the phase comparing means, the control signal output means, and at least one of the first and second variable delay means constituting a DLL circuit for performing a delay synchronization process on the first and second comparison signals, the synchronization loop circuit including the DLL circuit, the reference signal including the first comparison signal, the comparison output signal including the second comparison signal, and the clock recovery circuit further includes majority means for outputting at least two of three signal levels of the multiple clock, the first delayed multiple clock, and the second delayed multiple clock which are provided moment by moment as a signal level of the recovered clock.

Preferably, according to a twelfth aspect of the present invention, in the digital data transmission system of the tenth aspect, the clock recovery circuit includes: phase comparing means for making a comparison between the phase of a system clock independent of the multiple clock and the phase of an oscillation signal, control signal output means for outputting a control signal on the basis of a result of the phase comparison of the phase comparing means, oscillating means for generating the oscillation signal at an oscillation frequency based on the control signal, first variable delay means for providing a time delay of the predetermined period to the multiple clock on the basis of the control signal to output a first delayed multiple clock, and second variable delay means for providing a time delay of the predetermined period to the first delayed multiple clock on the basis of the control signal to output a second delayed multiple clock, the phase comparing means, the control signal output means, and the oscillating means constituting a PLL circuit for performing a phase synchronization process on the system clock and the oscillation signal, the synchronization loop circuit including the PLL circuit, the reference signal including the system clock, the comparison output signal including the oscillation signal, and the clock recovery circuit further includes majority means for outputting at least two of three signal levels of the multiple clock, the first delayed multiple clock, and the second delayed multiple clock which are provided moment by moment as a signal level of the recovered clock.

A thirteenth aspect of the present invention is intended for a digital data transmission system for transmitting digital data in a frame synchronization manner. According to the present invention, the digital data transmission system comprises first to Nth transmitting portions for transmitting digital data, and a receiving portion for receiving the digital data, the first to Nth transmitting portions comprising clock multiplexing circuits, respectively, for multiplexing first to Nth frame pulse signals for frame synchronization with first to Nth clocks having first to Nth periods to output first to Nth multiple clocks to the receiving portion, the receiving portion comprising: a clock recovery circuit for reproducing the first to Nth clocks from the first to Nth multiple clocks to provide first to Nth recovered clocks respectively by using a synchronization loop circuit for synchronizing a reference signal associated with the first multiple clock and a comparison output signal, and first to Nth frame pulse signal separation circuits for separating the first to Nth frame pulse signals from the first to Nth multiple clocks to provide first to Nth recovered frame pulse signals by using the first to Nth recovered clocks, respectively.

Preferably, according to a fourteenth aspect of the present invention, in the digital data transmission system of the thirteenth aspect, the clock recovery circuit has a synchronization detection function of detecting whether or not the synchronization loop circuit has synchronized the reference signal and the comparison output signal to output to the first transmitting portion a synchronization detection signal indicating whether the synchronization loop circuit is in a locked state in which the reference signal and the comparison output signal are synchronized or in an unlocked state in which the reference signal and the comparison output signal are not synchronized; and the clock multiplexing circuit of the first transmitting portion receives the synchronization detection signal, and has an enabling function of forcing the first clock to be outputted intactly as the first multiple clock when the synchronization detection signal indicates the unlocked state and of multiplexing the first frame pulse signal with the first clock to output the first multiple clock when the synchronization detection signal indicates the locked state.

Preferably, according to a fifteenth aspect of the present invention, in the digital data transmission system of the thirteenth aspect, the clock recovery circuit includes: phase comparing means for making a comparison between the phase of the first multiple clock and the phase of a first delayed multiple clock, control signal output means for outputting a control signal on the basis of a result of the phase comparison of the phase comparing means, first to Nth variable delay means for providing time delays of n times the first to Nth periods (where n is a natural number) to the first to Nth multiple clocks commonly on the basis of the control signal to output first to Nth delayed multiple clocks respectively, and first to Nth logical OR means for ORing the first to Nth multiple clocks and the first to Nth delayed multiple clocks to output the first to Nth recovered clocks respectively, the phase comparing means, the control signal output means, and the first variable delay means constituting a DLL circuit for performing a delay synchronization process on the first multiple clock and the first delayed multiple clock, the synchronization loop circuit including the DLL circuit, the reference signal including the first multiple clock, the comparison output signal including the first delayed multiple clock.

Preferably, according to a sixteenth aspect of the present invention, in the digital data transmission system of the thirteenth aspect, the clock recovery circuit includes: phase comparing means for making a comparison between the phase of a system clock independent of the first to Nth multiple clocks and the phase of an oscillation signal, control signal output means for outputting a control signal on the basis of a result of the phase comparison of the phase comparing means, oscillating means for generating the oscillation signal at an oscillation frequency based on the control signal, first to Nth variable delay means for providing time delays of the first to Nth periods to the first to Nth multiple clocks commonly on the basis of the control signal to output first to Nth delayed multiple clocks respectively, and first to Nth logical OR means for ORing the first to Nth multiple clocks and the first to Nth delayed multiple clocks to output the first to Nth recovered clocks respectively, the phase comparing means, the control signal output means, and the oscillating means constituting a PLL circuit for performing a phase synchronization process on the system clock and the oscillation signal, the synchronization loop circuit including the PLL circuit, the reference signal including the system clock, the comparison output signal including the oscillation signal.

Preferably, according to a seventeenth aspect of the present invention, in the digital data transmission system of the thirteenth aspect, the ith frame pulse signal separation circuit (i=1 to N) includes fixed value detecting means for detecting whether or not the ith multiple clock maintains a fixed value for the ith period to output the ith recovered frame pulse signal which is active when the ith multiple clock maintains the fixed value for the ith period and is inactive otherwise.

An eighteenth aspect of the present invention is intended for a digital data transmission system for transmitting digital data in a frame synchronization manner. According to the present invention, the digital data transmission system comprises first and second transmitting and receiving portions for transmitting digital data and for receiving digital data, the first transmitting and receiving portion comprising a first clock multiplexing circuit for multiplexing a first frame pulse signal for frame synchronization with a first clock having a predetermined period to output a first multiple clock to the second transmitting and receiving portion, the second transmitting and receiving portion comprising a second clock multiplexing circuit for multiplexing a second frame pulse signal for frame synchronization with a second clock having the predetermined period to output a second multiple clock to the first transmitting and receiving portion, the first transmitting and receiving portion further comprising: a first clock recovery circuit for reproducing the second clock as a first recovered clock from the second multiple clock to provide the first recovered clock by using a first synchronization loop circuit for synchronizing a first reference signal associated with the second multiple clock and a first comparison output signal, the first clock recovery circuit having a synchronization detection function of detecting whether or not the first reference signal and the first comparison output signal have been synchronized to output a first synchronization detection signal indicating whether the first synchronization loop circuit is in a locked state in which the first reference signal and the first comparison output signal are synchronized or in an unlocked state in which the first reference signal and the first comparison output signal are not synchronized, and a first frame pulse signal separation circuit for separating the second frame pulse signal as a first recovered frame pulse signal from the second multiple clock to provide the first recovered frame pulse signal by using the first recovered clock, the second transmitting and receiving portion further comprising: a second clock recovery circuit for reproducing the first clock as a second recovered clock from the first multiple clock to provide the second recovered clock by using a second synchronization loop circuit for synchronizing a second reference signal associated with the first multiple clock and a second comparison output signal, the second clock recovery circuit having a synchronization detection function of detecting whether or not the second reference signal and the second comparison output signal have been synchronized to output a second synchronization detection signal indicating whether the second synchronization loop circuit is in a locked state in which the second reference signal and the second comparison output signal are synchronized or in an unlocked state in which the second reference signal and the second comparison output signal are not synchronized, and a second frame pulse signal separation circuit for separating the first frame pulse signal as a second recovered frame pulse signal from the first multiple clock to provide the second recovered frame pulse signal by using the second recovered clock, wherein the first clock multiplexing circuit of the first transmitting and receiving portion receives the first synchronization detection signal, and has an enabling function of forcing the first clock to be outputted intactly as the first multiple clock when the first synchronization detection signal indicates the unlocked state and of multiplexing the first frame pulse signal with the first clock to output the first multiple clock when the first synchronization detection signal indicates the locked state, and wherein the second clock multiplexing circuit of the second transmitting and receiving portion receives the second synchronization detection signal, and has an enabling function of forcing the second clock to be outputted intactly as the second multiple clock when the second synchronization detection signal indicates the unlocked state and of multiplexing the second frame pulse signal with the second clock to output the second multiple clock when the second synchronization detection signal indicates the locked state.

As above described, in the digital data transmission system in accordance with the first aspect of the present invention, the transmitting portion employs the clock multiplexing circuit to multiplex the frame pulse signal for frame synchronization with the clock having the predetermined period to output the multiple clock to the receiving portion, and the receiving portion employs the clock recovery circuit and the frame pulse signal separation circuit to reproduce the clock and the frame pulse signal from the multiple clock to provide the recovered clock and the recovered frame pulse signal.

Thus, two signal lines which have been required to transmit the frame pulse signal and the clock are reduced to one signal line for transmitting the multiple clock. Further, since the clock is a signal having regularly repeated high and low levels during the predetermined period, the clock multiplexing circuit, the clock recovery circuit and the frame pulse signal separation circuit may be of relatively simple circuit construction.

The clock shaping means of the clock multiplexing circuit in accordance with the second aspect of the present invention performs the shaping process of masking the clock at the fixed value at least for the predetermined period during the time the frame pulse signal is active, and outputs the clock intactly as the multiple clock for other time periods.

Therefore, the clock shaping means may be relatively readily constructed using a latch for storing the frame pulse signal in response to the high and low levels of the clock, and a simple logic gate for logic operation which outputs the fixed value when the output from the latch indicates that the frame pulse signal is active and which outputs the clock intactly when the output from the latch indicates that the frame pulse signal is inactive.

The clock shaping means in accordance with the third aspect of the present invention includes the enabling means for disabling the shaping process to force the clock to be outputted intactly as the multiple clock when the enable signal is inactive. The clock may be outputted intactly as the multiple clock as required.

The clock recovery circuit in accordance with the fourth aspect of the present invention supplies as the recovered clock the comparison output signal from the PLL circuit which performs the phase synchronization process on the multiple clock and the comparison output signal. Thus, the clock recovery circuit may be of a relatively simple circuit construction comprised of only the PLL circuit.

The masking means of the clock recovery circuit in accordance with the fifth aspect of the present invention disables the phase synchronization process of the PLL circuit when the recovered frame pulse signal indicates the active state, thereby preventing the malfunctions of the phase synchronization process at a position of the multiple clock where the frame pulse signal which is active is multiplexed.

The synchronization detecting means of the clock recovery circuit in accordance with the sixth aspect of the present invention disables the phase synchronization process upon detection of the synchronization of the multiple clock and recovered clock. Thus, the stable recovered clock may be provided after the synchronization detection.

The clock recovery circuit in accordance with the seventh aspect of the present invention comprises the DLL circuit for performing the delay synchronization process on the multiple clock and the delayed multiple clock, and the logical OR means for ORing the multiple clock and the delayed multiple clock to output the recovered clock.

The clock recovery circuit in accordance with the seventh aspect of the present invention which employs the DLL circuit may to reduce the time required for synchronization to provide the recovered clock at an early stage. Further, since the variable delay element should provide the time delay of n times the period of the clock, the range of the frequency of the clock for synchronization is widely extended.

The clock recovery circuit in accordance with the eighth aspect of the present invention comprises the PLL circuit for performing the phase synchronization process on the system clock and the oscillation signal, and the logical OR means for ORing the multiple clock and the delayed multiple clock to output the recovered clock.

Since the system clock serving as the reference signal is independent of the multiple clock and is not multiplexed with the frame pulse signal, the PLL circuit in accordance with the eighth aspect of the present invention may perform the phase synchronization process without malfunctions, and the logical OR means may provide the highly stable recovered clock at an early stage.

The fixed value detecting means of the frame pulse signal separation circuit in accordance with the ninth aspect of the present invention outputs the recovered frame pulse signal which is active when the multiple clock maintains the fixed value for the predetermined period.

Therefore, the fixed value detecting means may be of a relatively simple construction by employing latch means for latching the value of the multiple clock when the clock does not have the fixed value for each predetermined period on the basis of the regularity of the recovered clock and the clock.

The clock shaping means of the clock multiplexing circuit in accordance with the tenth aspect of the present invention performs the shaping process of doubling the predetermined period of the clock to output the multiple clock during the time the frame pulse signal is active. The multiplexing of the frame pulse signal allows the production of the multiple clock having a good DC balance.

The clock recovery circuit in accordance with the eleventh aspect of the present invention comprises the DLL circuit for performing the delay synchronization process on the first and second comparison signals which are two of the multiple clock, the first delayed multiple clock and the second delayed multiple clock, and the majority means for outputting at least two of the three signal levels of the multiple clock, the first delayed multiple clock and the second delayed multiple clock which are provided moment by moment as the signal level of the recovered clock.

Thus, the clock recovery circuit in accordance with the eleventh aspect of the present invention which employs the DLL circuit may reduce the time required for synchronization to provide the recovered clock from the output of the majority means at an early stage. Further, since the variable delay element should provide the time delay of n times the period of the clock, the range of the frequency of the clock for synchronization is widely extended.

The clock recovery circuit in accordance with the twelfth aspect of the present invention comprises the PLL circuit for performing the phase synchronization process on the system clock and the oscillation signal, and the majority means for outputting at least two of the three signal levels of the multiple clock, the first delayed multiple clock and the second delayed multiple clock which are provided moment by moment as the signal level of the recovered clock.

Since the system clock serving as the reference signal is independent of the multiple clock and is not multiplexed with the frame pulse signal, the PLL circuit in accordance with the twelfth aspect of the present invention may perform the phase synchronization process without malfunctions, and the majority means may provide the highly stable recovered clock at an early stage.

In the digital data transmission system in accordance with the thirteenth aspect of the present invention, the clock recovery circuit provides the first to Nth recovered clocks from the first to Nth multiple clocks by using the synchronization loop circuit for synchronizing the reference signal associated with the first multiple clock and the comparison output signal. The supply of the N recovered clocks from the single synchronization loop circuit allows the significant reductions in circuit size and power consumption.

The clock multiplexing circuit of the first transmitting portion in accordance with the fourteenth aspect of the present invention forces the first clock to be outputted intactly as the first multiple clock when the synchronization detection signal from the receiving portion indicates the unlocked state, and multiplexes the first frame pulse signal with the first clock to output the first multiple clock when the synchronization detection signal indicates the locked state.

Thus, the clock recovery circuit of the receiving portion may receive the first clock as the first multiple clock until the synchronization loop circuit is locked. The clock recovery circuit may be synchronized with the reference signal associated with the first multiple clock at an early stage without malfunctions.

The clock recovery circuit in accordance with the fifteenth aspect of the present invention employs the DLL circuit for performing the delay synchronization process on the first multiple clock and the first delayed multiple clock to reduce the time required for synchronization, thereby providing the first to Nth recovered clocks from the outputs of the first to Nth logical OR means at an early stage. Further, since the variable delay element should provide the time delay of n times the period of the clock, the range of the frequency of the clock for synchronization is widely extended.

The clock recovery circuit in accordance with the sixteenth aspect of the present invention employs the PLL circuit for performing the phase synchronization process on the system clock and the oscillation signal. Since the system clock serving as the reference signal is independent of the first to Nth multiple clocks and is not multiplexed with the frame pulse signals, the PLL circuit may perform the phase synchronization process without malfunctions, and the outputs of the first to Nth logical OR means may provide the highly stable first to Nth recovered clocks at an early stage.

The fixed value detecting means of each of the first to Nth frame pulse signal separation circuits in accordance with the seventeenth aspect of the present invention outputs the ith recovered frame pulse signal (i=1 to N) which is active when the ith multiple clock maintains the fixed value for the ith period.

Therefore, the fixed value detecting means may be of a relatively simple construction by employing latch means for latching the value of the ith multiple clock when the ith clock does not have the fixed value for each predetermined period on the basis of the regularity of the ith recovered clock and the ith clock.

In the digital data transmission system in accordance with the eighteenth aspect of the present invention, the first clock multiplexing circuit of the first transmitting and receiving portion has the enabling function of forcing the first clock to be outputted intactly as the first multiple clock when the first synchronization detection signal indicates the unlocked state, and of multiplexing the first frame pulse signal with the first clock to output the first multiple clock when the first synchronization detection signal indicates the locked state. The second clock multiplexing circuit of the second transmitting and receiving portion has the enabling function of forcing the second clock to be outputted intactly as the second multiple clock when the second synchronization detection signal indicates the unlocked state, and of multiplexing the second frame pulse signal with the second clock to output the second multiple clock when the second synchronization detection signal indicates the locked state.

Since the first and second clocks have the same period, the first and second synchronization loop circuits require substantially the same time to synchronize the first and second reference signals associated with the second and first clocks and the first and second comparison output signals to change to the locked state.

Thus, the first clock multiplexing circuit of the first transmitting and receiving portion may output the first clock as the first multiple clock on the basis of the first synchronization detection signal provided therein until the locked state of the second synchronization loop circuit of the second transmitting and receiving portion is estimated. Therefore, the second synchronization loop circuit of the second clock recovery circuit of the second transmitting and receiving portion may be locked at an early stage without malfunctions.

Likewise, the second clock multiplexing circuit of the second transmitting and receiving portion may output the second clock as the second multiple clock on the basis of the second synchronization detection signal provided therein until the locked state of the first synchronization loop circuit of the first transmitting and receiving portion is estimated.

Therefore, the first synchronization loop circuit of the first clock recovery circuit of the first transmitting and receiving portion may be locked at an early stage without malfunctions.

Additionally, the first and second clock multiplexing circuits change the contents of the first and second multiple clocks on the basis of the first and second synchronization detection signals provided therein, requiring the addition of no external signal lines for transmitting and receiving a signal to and from the exterior.

It is therefore an object of the present invention to provide a digital data transmission system which is capable of transmitting digital data, a frame pulse signal, and a clock using a required minimum number of signal lines and with a simple circuit structure.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
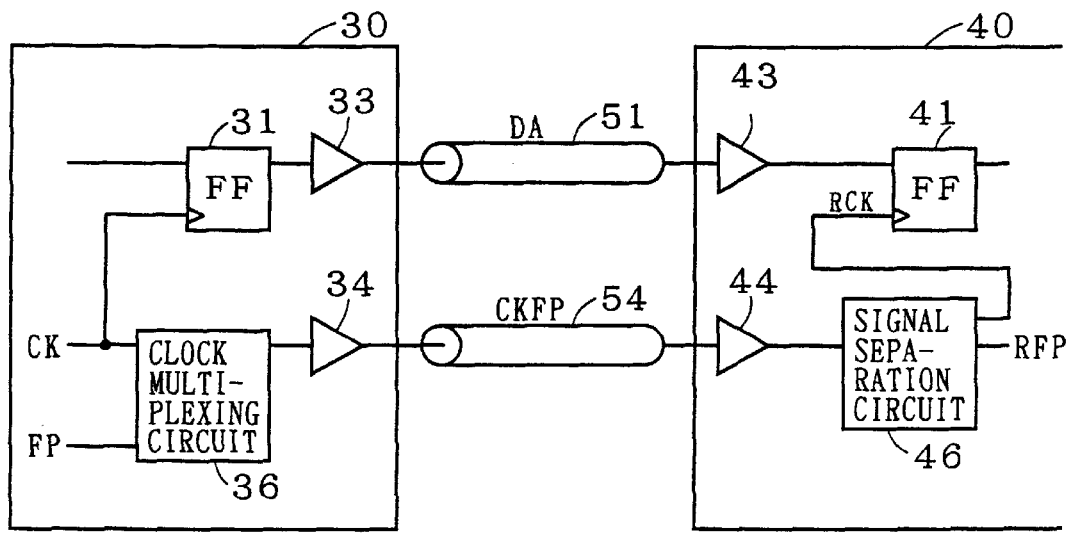
FIG. 1 illustrates a general structure of a digital data transmission system according to a first preferred embodiment of the present invention.

FIG. 1 is a block diagram showing a general structure of a digital data transmission system according to a first preferred embodiment of the present invention. As shown, upon receipt of a clock CK having a period T and a frame pulse signal FP, a clock multiplexing circuit 36 in a transmitting portion 30 multiplexes the frame pulse signal FP with the clock CK to output a multiple clock CKFP through a driver 34 to the exterior. The multiple clock CKFP is transmitted through a transmission line 54 to a receiving portion 40. A flip-flop 31 outputs digital data DA through a driver 33 in synchronism with the clock CK in the transmitting portion 30. The data DA is transmitted through a transmission line 51 to the receiving portion 40.

A signal separation circuit 46 in the receiving portion 40 receives the multiple clock CKFP through a driver 44 to separate a recovered clock RCK and a recovered frame pulse signal RFP from each other based on the multiple clock CKFP. A flip-flop 41 receives the data DA through a driver 43 to perform signal processing on the data DA in synchronism with the recovered clock RCK.

Figure 2:
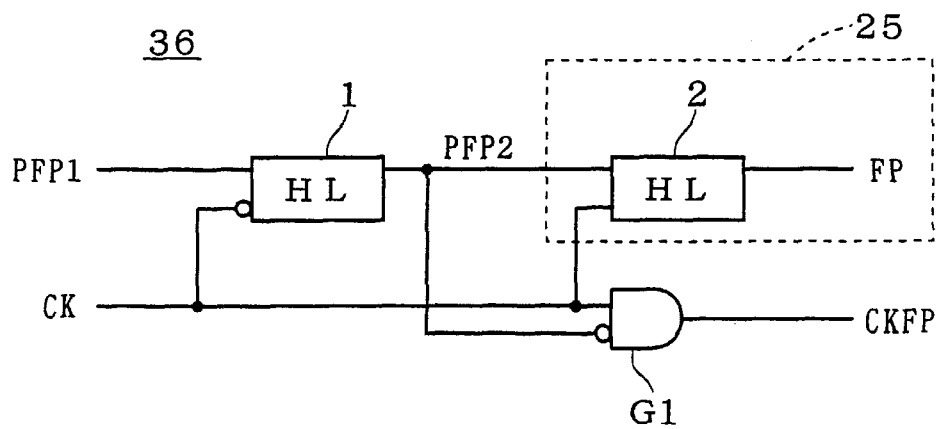
FIG. 2 is a circuit diagram showing an internal structure of a clock multiplexing circuit in a transmitting portion shown in FIG. 1.

FIG. 2 is a circuit diagram showing an internal structure of the clock multiplexing circuit 36. As shown, the clock multiplexing circuit 36 comprises half latches 1, 2, and an AND gate G1.

For purposes of explanation, the frame pulse signal FP a half clock period (T/2) earlier is referred to as a preliminary frame pulse signal PFP2, and the frame pulse signal FP one clock period (T) earlier is referred to as a preliminary frame pulse signal PFP1.

The half latch 1 receives the preliminary frame pulse signal PFP1 and an inverted version of the clock CK. When the clock CK is low, the half latch 1 is in a through state wherein the preliminary frame pulse signal PFP1 is outputted intactly as the preliminary frame pulse signal PFP2. When the clock CK is high, the half latch 1 is in a latch state wherein an immediately preceding output value of the preliminary frame pulse signal PFP1 is outputted as the preliminary frame pulse signal PFP2.

The half latch 2 receives the preliminary frame pulse signal PFP2 and the clock CK When the clock CK is high, the half latch 2 is in a through state wherein the preliminary frame pulse signal PFP2 is outputted intactly as the frame pulse signal FP. When the clock CK is low, the half latch 2 is in a latch state wherein an immediately preceding output value of the preliminary frame pulse signal PFP2 is outputted as the frame pulse signal FP.

Figure 31:
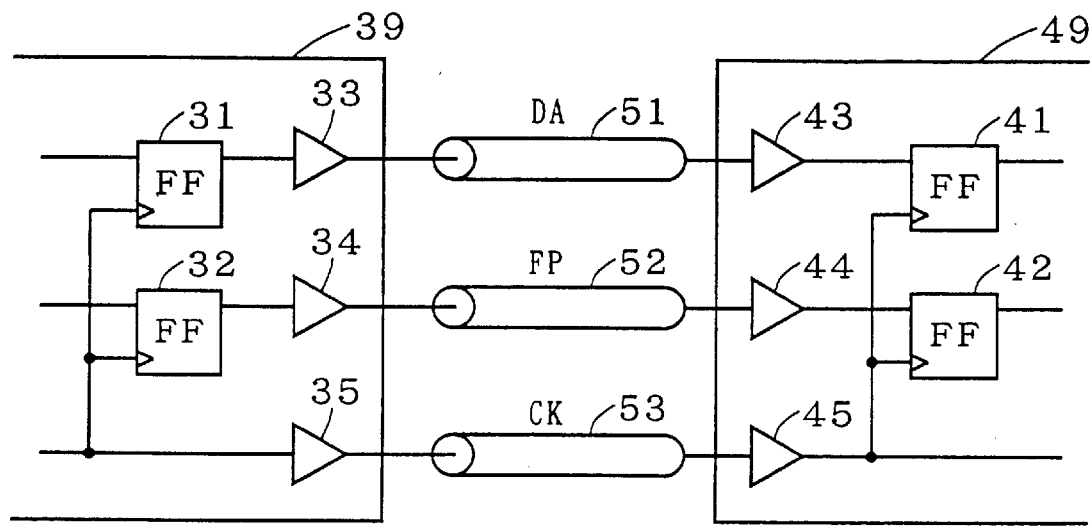
FIG. 31 illustrates a structure of a conventional digital data transmission system.
Figure 32:
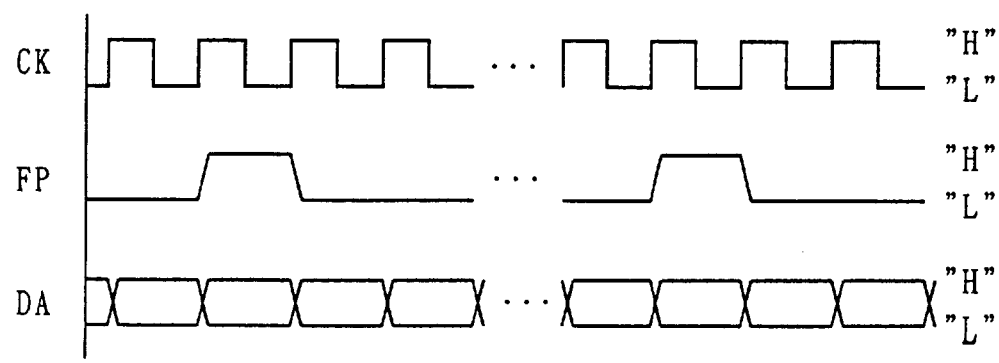
FIG. 32 is a timing chart showing an example of transmission of a conventional frame pulse signal and a clock.
Figure 33:
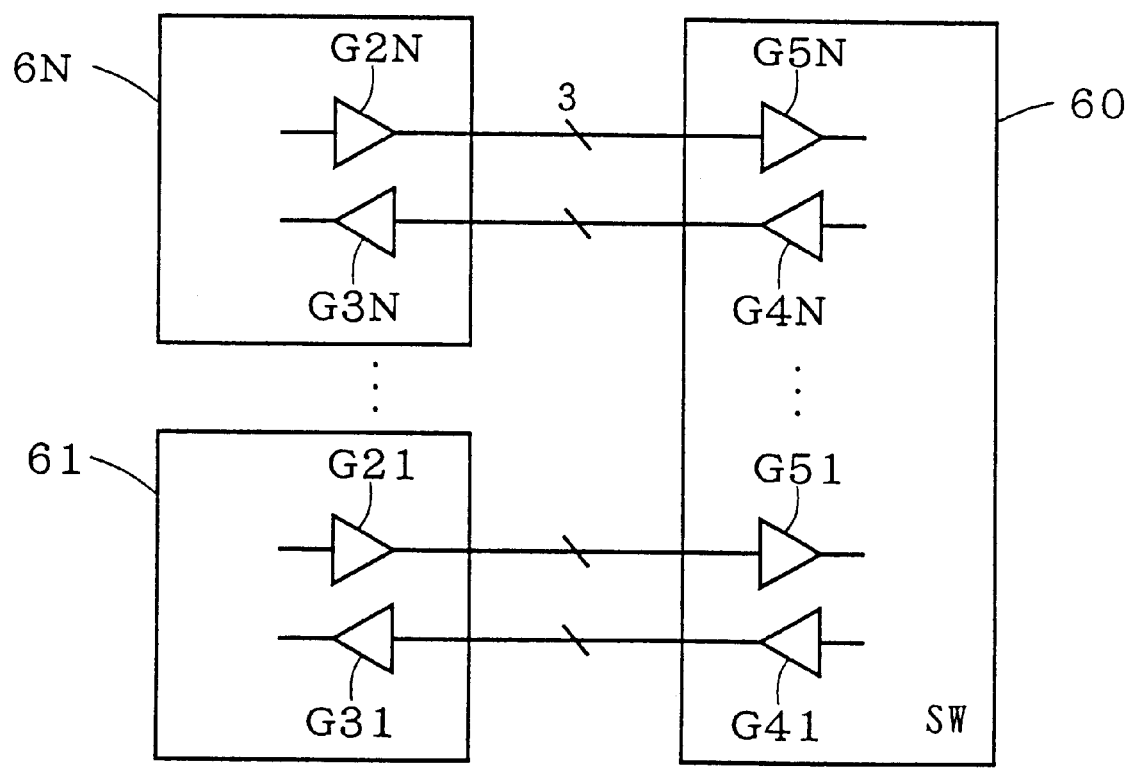
FIG. 33 illustrates a structure of another conventional digital data transmission system.

The above described half latches 1 and 2 have constituted the flip-flop 32 (FIG. 31) in the conventional transmitting portion 39. The clock multiplexing circuit 36 further comprises the AND gate G1 in addition to the conventional flip-flop 32.

The AND gate G1 receives the clock CK and an inverted version of the preliminary frame pulse signal PFP2 to output the AND of the clock CK and the inverted version of the preliminary frame pulse signal PFP2 as the multiple clock CKFP.

Figure 3:
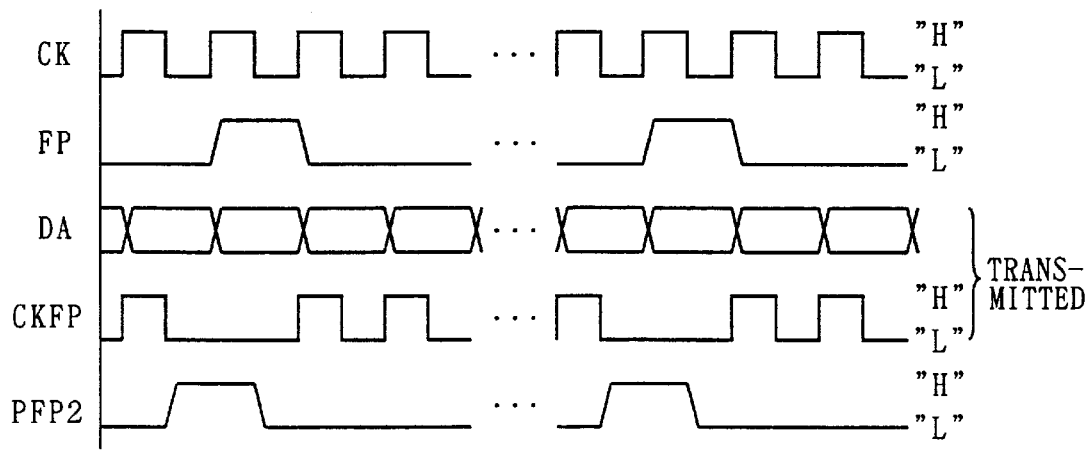
FIG. 3 is a timing chart showing the operation of the clock multiplexing circuit of FIG. 2.

FIG. 3 is a timing chart showing the multiplexing operation of the clock multiplexing circuit 36. As shown, when the clock CK and the frame pulse signal FP (preliminary frame pulse signal PFP2) are generated, a signal corresponding to the clock CK which is masked (fixed to "L" for the period T of the clock CK or longer) during the time the frame pulse signal FP is active is outputted as the multiple clock CKFP.

The clock multiplexing circuit 36 is required to output only the multiple clock CKFP but is not required to output the frame pulse signal FP. Thus, the half latch 2 is not required in practice, and the clock multiplexing circuit 36 may be comprised of only the half latch 1 and the AND gate G1. A portion 25 which is not required may be dispensed with.

The half latches 1 and 2 in combination are equivalent to the conventional flip-flop 42. Then, only the addition of the AND gate G1 is required when the conventional transmitting circuit is utilized.

Figure 4:
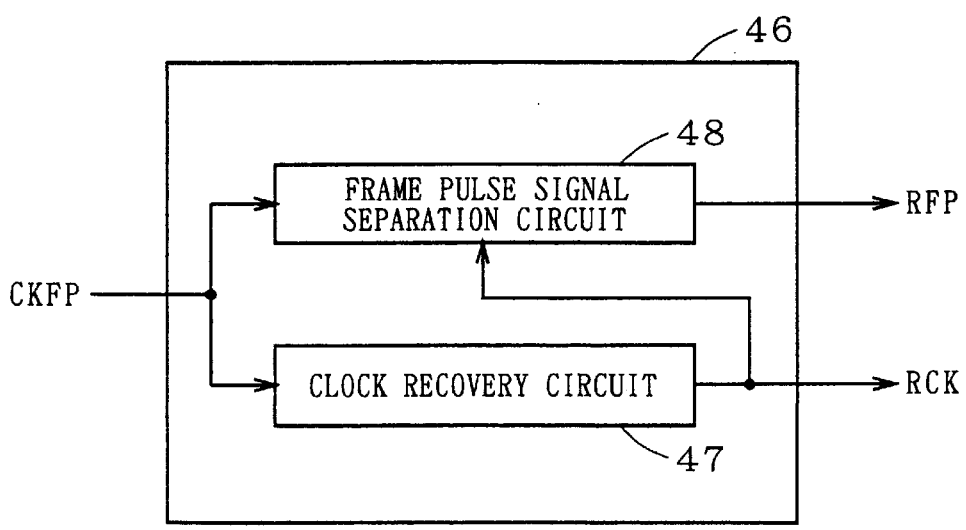
FIG. 4 is a block diagram of a signal separation circuit in a receiving portion shown in FIG. 1.

FIG. 4 is a block diagram showing an internal structure of the signal separation circuit 46. As shown, the signal separation circuit 46 comprises a clock recovery circuit 47 and a frame pulse signal separation circuit 48.

Figure 5:
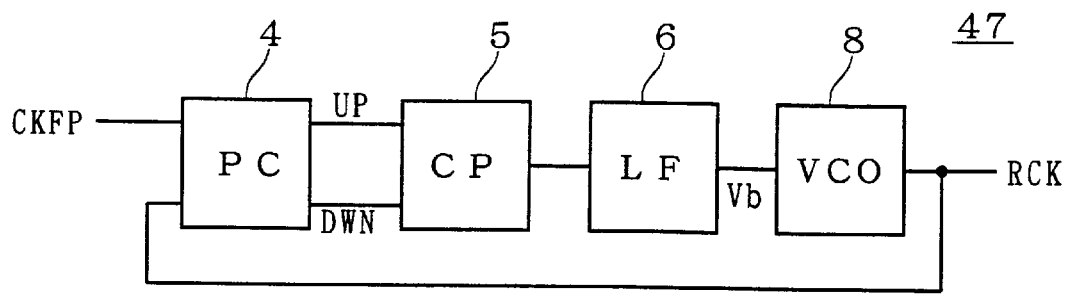
FIG. 5 is a block diagram showing an internal structure of a clock recovery circuit shown in FIG. 4.

FIG. 5 is a block diagram showing an internal structure of the clock recovery circuit 47. As shown, the clock recovery circuit 47 comprises a PLL (phase locked loop) circuit including a phase comparator 4, a charge pump 5, a loop filter 6, and a voltage-controlled oscillator 8.

The phase comparator 4 makes a comparison between the phase of the multiple clock CKFP and the phase of the recovered clock RCK to output an up signal UP and a down signal DWN to the charge pump 5. The charge pump 5 applies a control voltage Vb through the loop filter 6 to the voltage-controlled oscillator 8 on the basis of the up signal UP and the down signal DWN. The voltage-controlled oscillator 8 outputs the recovered clock RCK which oscillates at an oscillation frequency based on the control voltage Vb.

Thus, the PLL circuit synchronizes the multiple clock CKFP and the recovered clock RCK to provide the recovered clock RCK which is a substantially correct reproduction of the clock CK.

The clock recovery circuit 47 which may comprise only the PLL circuit has a relatively simple circuit arrangement.

Figure 6:
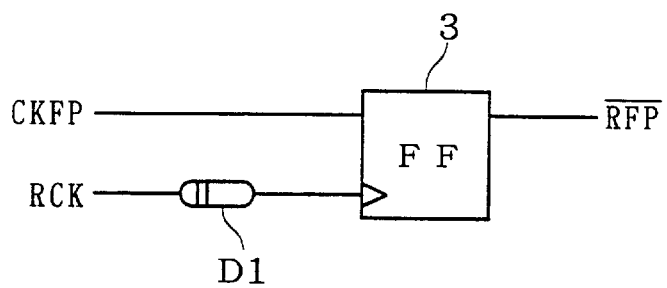
FIG. 6 is a circuit diagram showing an internal structure of a frame pulse signal separation circuit shown in FIG. 4.
Figure 7:
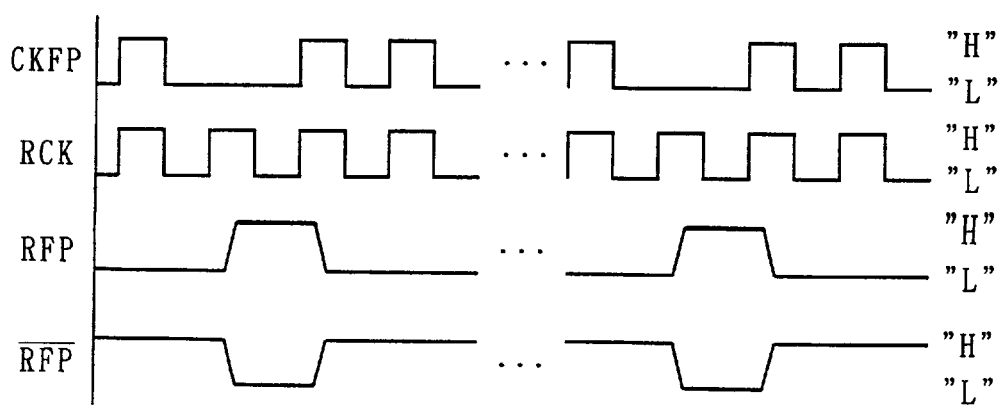
FIG. 7 is a timing chart showing the operation of the frame pulse signal separation circuit of FIG. 6.

FIG. 6 is a circuit diagram showing an internal structure of the frame pulse signal separation circuit 48. As shown, the frame pulse signal separation circuit 48 comprises a flip-flop 3 and a delay line D1. The flip-flop 3 has a clock input for receiving the recovered clock RCK through the delay line D1, and a data input for receiving the multiple clock CKFP. The time delay of the delay line D1 may be as short as not greater than one-half the period (T/2) of the clock CK The flip-flop 3 latches the multiple clock CKFP on the rising edge ("L" to "H" transition) of the clock input. Then, as shown in FIG. 7, the signal outputted from the flip-flop 3 is an inverted recovered frame pulse signal $\overline{RFP}$, and the frame pulse signal FP is reproduced.

The multiple clock CKFP has a waveform which mostly exhibits periodically repeated 1s and 0s. This eliminates the need for a complicated logic circuit that is required to detect the frame pulse signal from the data with which the frame pulse signal is multiplexed, but allows the easy reproduction of the frame pulse signal using the single flip-flop. That is, the conventional flip-flop for the frame pulse signal FP may be used as it is to detect the frame pulse signal without the need for an additional circuit.

In the digital data transmission system of the first preferred embodiment, as described above, the clock multiplexing circuit 36 of the transmitting portion 30 multiplexes the frame pulse signal FP with the clock CK to transmit the multiple clock CKFP, and the clock recovery circuit 47 and the frame pulse signal separation circuit 48 of the receiving portion 40 reproduce the recovered clock RCK and the recovered frame pulse signal RFP respectively. Therefore, the digital data transmission system of the first preferred embodiment requires a decreased number of signal lines for transmission with a simple circuit construction.

Second Preferred Embodiment

The multiple clock CKFP as a result of the multiplexing of the frame pulse signal FP with the clock CK has an incorrect clock waveform. Thus, the clock recovery circuit 47 including the PLL circuit of FIG. 5 generates the recovered clock RCK by phase comparison with the multiple clock CKFP, presenting the danger of incorrect reproduction of the clock CK. A second preferred embodiment of the present invention is intended to eliminate the danger.

Figure 8:
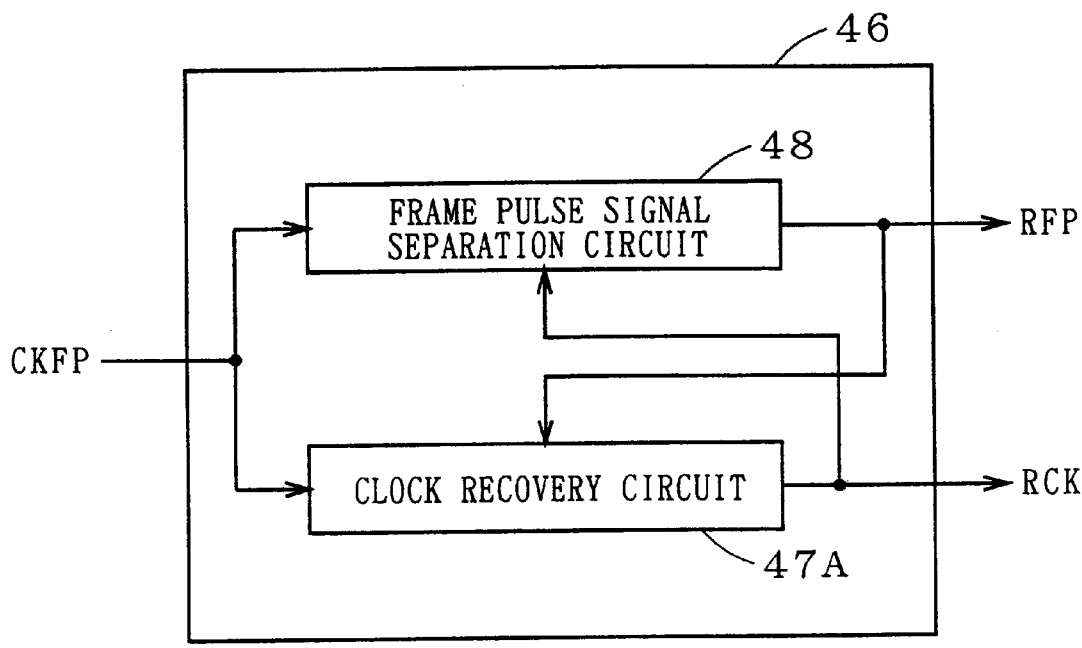
FIG. 8 is a block diagram of the signal separation circuit according to a second preferred embodiment of the present invention.

FIG. 8 is a block diagram showing an internal structure of the signal separation circuit 46 in the digital data transmission system according to the second preferred embodiment of the present invention. As shown, the signal separation circuit 46 of the second preferred embodiment differs from that of the first preferred embodiment in that a clock recovery circuit 47A generates the recovered clock RCK based on the multiple clock CKFP and the recovered frame pulse signal RFP.

Figure 9:
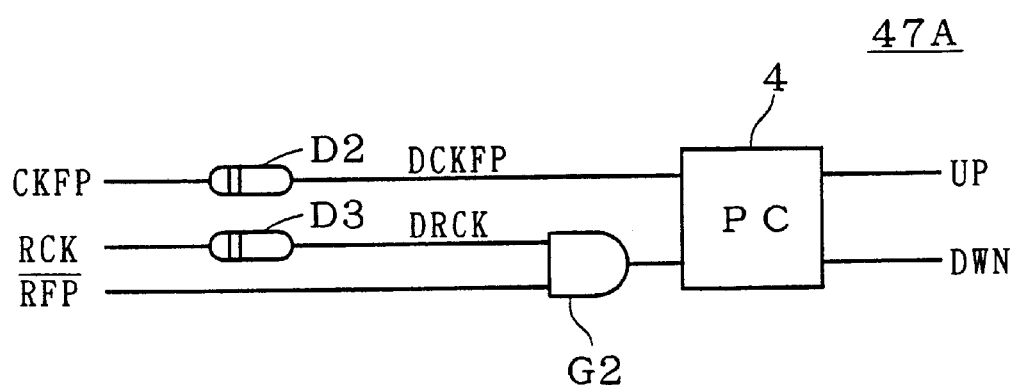
FIG. 9 is a partial circuit diagram of the clock recovery circuit shown in FIG. 8.

FIG. 9 is a circuit diagram showing an internal structure of the clock recovery circuit 47A around the phase comparator 4. As shown, the phase comparator 4 has a first input for receiving a delayed multiple clock DCKFP generated by a delay line D2 providing a delay to the multiple clock CKFP, and a second input for receiving the output from an AND gate G2, and is connected so as to make a comparison between the phase of the signal at its first input and the phase of the signal at it second input. The AND gate G2 receives a delayed recovered clock DRCK generated by a delay line D3 providing a delay to the recovered clock RCK, and the inverted recovered frame pulse signal $\overline{\text{RFP}}$ to output the AND of the delayed recovered clock DRCK and the inverted recovered frame pulse signal $\overline{\text{RFP}}$.

Figure 10:
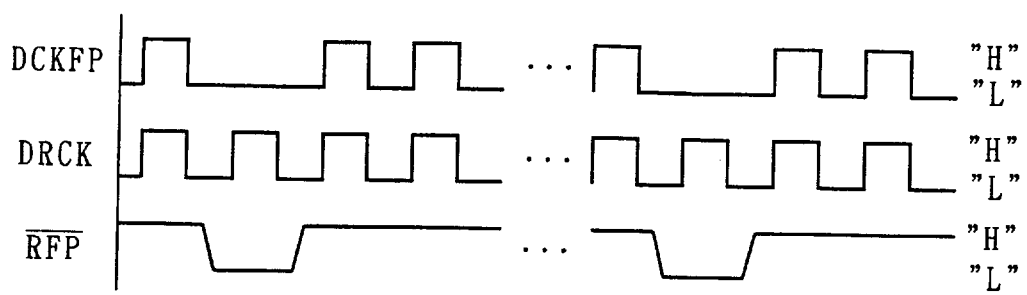
FIG. 10 is a timing chart showing the operation of the clock recovery circuit shown in FIG. 8.

The time delay of the delay line D2 equals the time delay of the delay line D3. These time delays are not greater than one-half the period (T/2) of the clock CK and satisfy the relationship shown in FIG. 10.

Then, the second input to the phase comparator 4 is the delayed recovered clock DRCK when the inverted recovered frame pulse signal $\overline{\text{RFP}}$ is high (the frame pulse signal FP is low), and is masked and forced low when the inverted recovered frame pulse signal $\overline{\text{RFP}}$ is low (the frame pulse signal FP is high).

Consequently, the output from the AND gate G2 is shaped into a waveform generally similar to the waveform of the delayed multiple clock DCKFP. This provides a correct phase comparison during the time the frame pulse signal FP is active, that is, the multiple clock CKFP is held low for one clock period or longer, permitting the recovered clock RCK to become a correct reproduction of the clock CK.

The elements of the clock recovery circuit 47A other than the phase comparator 4 are similar in connection to those shown in FIG. 5. The arrangement of the second preferred embodiment is similar to that of the first preferred embodiment shown in FIGS. 1 and 2 except the signal separation circuit 46.

Third Preferred Embodiment

Figure 11:
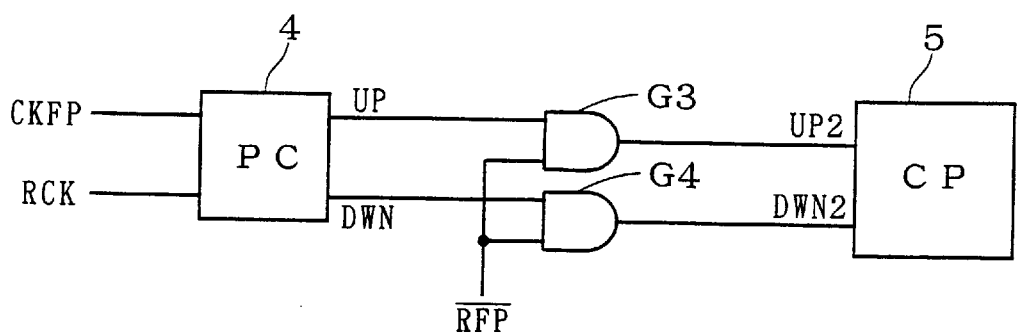
FIG. 11 is a partial circuit diagram of the clock recovery circuit according to a third preferred embodiment of the present invention.

FIG. 11 is a circuit diagram showing an internal structure of the clock recovery circuit 47A in the digital data transmission system around the phase comparator 4 according to a third preferred embodiment of the present invention. As shown, the up signal UP and the down signal DWN from the phase comparator 4 are not directly outputted to the charge pump 5 but are outputted to AND gates G3 and G4. Specifically, the up signal UP is applied to a first input of the AND gate G3, and the down signal DWN is applied to a first input of the AND gate G4. The AND gates G3 and G4 receive the inverted recovered frame pulse signal $\overline{\text{RFP}}$ at their second inputs.

The outputs from the AND gates G3 and G4 are outputted as an up signal UP2 and a down signal DWN2 to the charge pump 5 provided in the next stage.

Then, the up signal UP and down signal DWN are outputted intactly as the up signal UP2 and down signal DWN2 when the inverted recovered frame pulse signal $\overline{\text{RFP}}$ is high (the frame pulse signal FP is low). The up signal UP2 and down signal DWN2 are masked and forced low when the inverted recovered frame pulse signal $\overline{\text{RFP}}$ is low (the frame pulse signal FP is high).

Consequently, the phase comparison result (up signal UP and down signal DWN) from the phase comparator 4 are disabled during the time the multiple clock CKFP is held low for one clock period T or longer (during the time the inverted recovered frame pulse signal $\overline{\text{RFP}}$ is held low). This avoids the malfunctions of the charge pump 5 and provides a correct phase comparison during the time the multiple clock CKFP is held low for one clock period T or longer, permitting the recovered clock RCK to become a correct reproduction of the clock CK.

Since the phase comparison in the phase comparator 4 requires time not greater than a half clock period (T/2), it is not necessary to provide a delay to the multiple clock CKFP and the recovered clock RCK, unlike the second preferred embodiment shown in FIG. 9.

The elements of the clock recovery circuit 47A other than the phase comparator 4 are similar in connection to those shown in FIG. 5. The signal separation circuit 46 of the third preferred embodiment is similar in construction to that of the second preferred embodiment shown in FIG. 8. The arrangement of the third preferred embodiment is similar to that of the first preferred embodiment shown in FIGS. 1 and 2 except the signal separation circuit 46.

Fourth Preferred Embodiment

Figure 12:
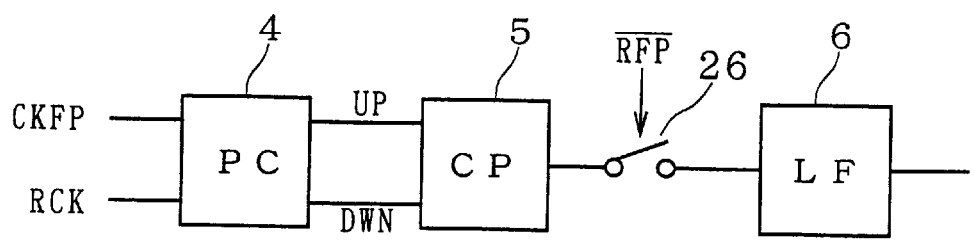
FIG. 12 is a partial circuit diagram of the clock recovery circuit according to a fourth preferred embodiment of the present invention.

FIG. 12 is a circuit diagram showing an internal structure of the clock recovery circuit 47A in the digital data transmission system around the phase comparator 4 according to a fourth preferred embodiment of the present invention. As shown, a switch 26 is connected between the charge pump 5 and the loop filter 6. The switch 26 is on when the inverted recovered frame pulse signal $\overline{\text{RFP}}$ is high (the frame pulse signal FP is low), and is off when the inverted recovered frame pulse signal $\overline{\text{RFP}}$ is low (the frame pulse signal FP is high). Turning off the switch 26 cuts off a current path between the charge pump 5 and the loop filter 6.

Then, the current path between the charge pump 5 and the loop filter 6 is cut off and the PLL circuit is disabled during the time the multiple clock CKFP is held low for one clock period T or longer (during the time the inverted recovered frame pulse signal $\overline{\text{RFP}}$ is held low for one clock period T or longer). This avoids the malfunctions of the PLL circuit if the phase comparator 4 and charge pump 5 malfunction, and provides a correct phase comparison during the time the multiple clock CKFP is held low for one clock period T or longer, permitting the recovered clock RCK to become a correct reproduction of the clock CK.

Since the phase comparison in the phase comparator 4 and the charging (up and down) in the charge pump 5 require time not greater than a half clock period (T/2), it is not necessary to provide a delay to the multiple clock CKFP and the recovered clock RCK, unlike the second preferred embodiment shown in FIG. 9.

The elements of the clock recovery circuit 47A other than the phase comparator 4 are similar in connection and construction to those shown in FIG. 5. The signal separation circuit 46 of the fourth preferred embodiment is similar in construction to that of the second preferred embodiment shown in FIG. 8. The arrangement of the fourth preferred embodiment is similar to that of the first preferred embodiment shown in FIGS. 1 and 2 except the signal separation circuit 46.

Fifth Preferred Embodiment

Figure 13:
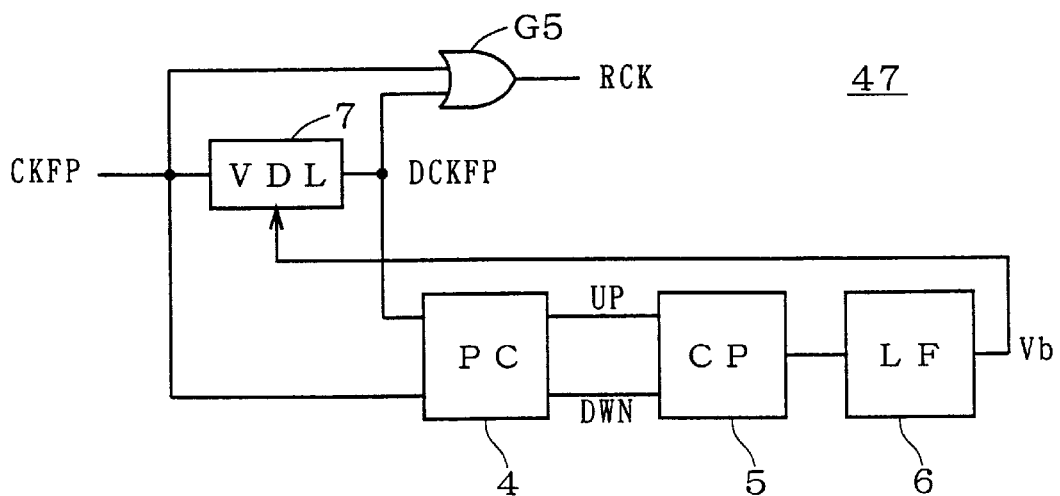
FIG. 13 is a partial circuit diagram of the clock recovery circuit according to a fifth preferred embodiment of the present invention.

FIG. 13 is a block diagram showing an internal structure of the clock recovery circuit 47 in the digital data transmission system according to a fifth preferred embodiment of the present invention. As shown, the clock recovery circuit 47 comprises the phase comparator 4, the charge pump 5, the loop filter 6, a variable delay line 7, and an OR gate G5.

The phase comparator 4 makes a comparison between the phase of the multiple clock CKFP and the phase of the delayed multiple clock DCKFP to output the up signal UP and the down signal DWN to the charge pump 5. The charge pump 5 applies the control voltage Vb through the loop filter 6 to the variable delay line 7 on the basis of the up signal UP and the down signal DWN.

The variable delay line 7 provides a time delay based on the control voltage Vb to the multiple clock CKFP to provide the delayed multiple clock DCKFP. The OR gate G5 performs an OR operation on the multiple clock CKFP and the delayed multiple clock DCKFP to output the recovered clock RCK.

In the clock recovery circuit 47 of the fifth preferred embodiment, the phase comparator 4, the charge pump 5, the loop filter 6, and the variable delay line 7 constitute a DLL (delay locked loop), and a time delay of n clock periods nT of the variable delay line 7 is controlled so that the delayed multiple clock DCKFP and the multiple clock CKFP are in phase. Thus, the delayed multiple clock DCKFP lags correctly n clock periods (where n is a natural number) behind the multiple clock CKFP. For example, the delayed multiple clock DCKFP which lags correctly one clock period T behind the multiple clock CKFP may be provided as shown in FIG. 14.

Figure 14:
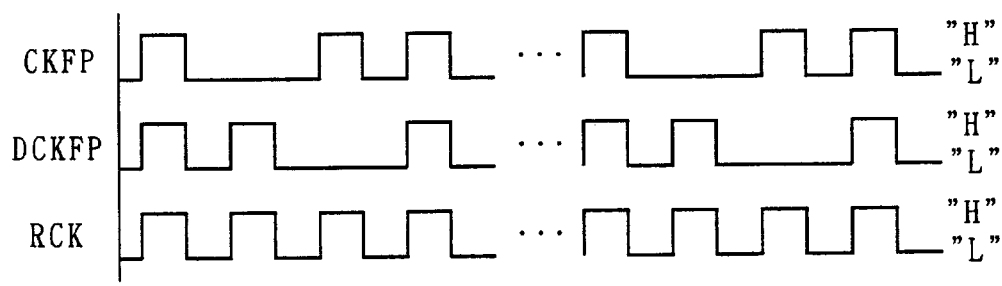
FIG. 14 is a timing chart showing the operation of the clock recovery circuit of FIG. 13.

Thus, ORing the multiple clock CKFP and the delayed multiple clock DCKFP which lags one clock period behind the multiple clock CKFP allows the delayed multiple clock DCKFP to modify a time period over which the multiple clock CKFP is held low for one clock period T or longer, achieving the correct reproduction of the recovered clock RCK as shown in FIG. 14.

Additionally, the use of the DLL for reproduction of the recovered clock RCK reduces the length of time required to synchronize the phases of the multiple clock CKFP and the delayed multiple clock DCKFP as compared with the use of the PLL. The variable delay line 7 which should provide the time delay of n clock periods nT may increase the range of the frequency of the recovered clock RCK at which the DLL can be locked as compared with the PLL to respond to a higher-speed clock CK.

Other elements of the digital data transmission system of the fifth preferred embodiment are similar in construction to those of the first preferred embodiment shown in FIGS. 2 and 5.

Sixth Preferred Embodiment

Figure 15:
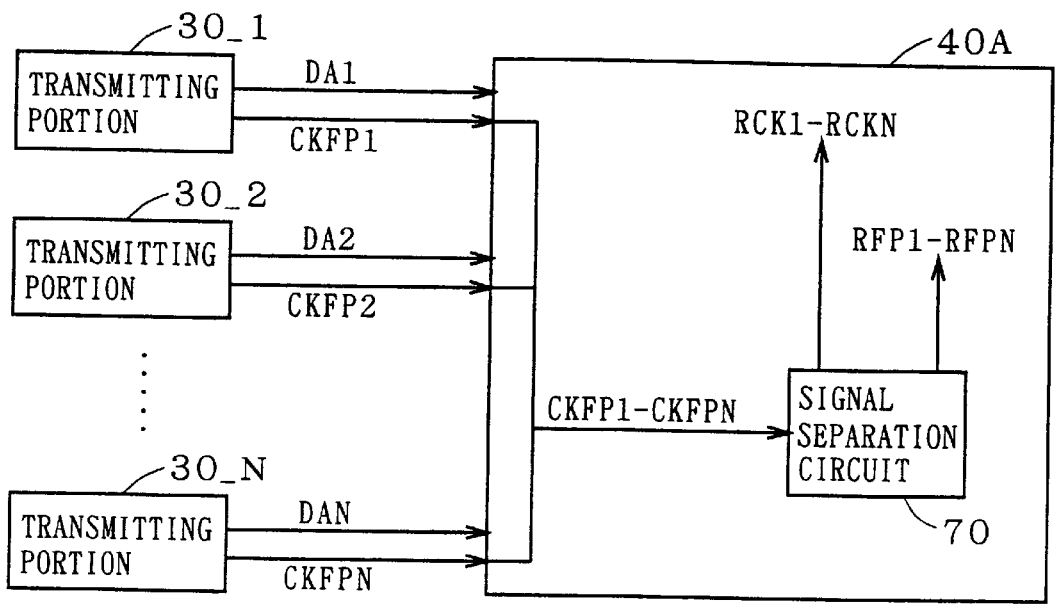
FIG. 15 illustrates a general structure of the digital data transmission system according to a sixth preferred embodiment of the present invention.

FIG. 15 is a block diagram showing a general structure of the digital data transmission system according to a sixth preferred embodiment of the present invention. As shown, N transmitting portions 30_1 to 30_N output data DA1 to DAN and multiple clocks CKFP1 to CKFPN, respectively. A receiving portion 40A receives all of the outputs from the transmitting portions 30_1 to 30_N.

The receiving portion 40A comprises a signal separation circuit 70 for reproducing recovered clocks RCK1 to RCKN and recovered frame pulse signals RFP1 to RFPN from the multiple clocks CKFP1 to CKFPN. Each of the transmitting portions 30_1 to 30_N is similar in internal construction to the transmitting portion 30 of the first preferred embodiment shown in FIGS. 1 and 2, and comprises a clock multiplexing circuit. The receiving portion 40A, similar in internal construction to the receiving portion 40 shown in FIG. 1, comprises flip-flops for processing data DA1 to DAN and operating in synchronism with the recovered clocks RCK1 to RCKN, respectively. For purposes of explanation, only a characteristic portion associated with the separation of the multiple clocks CKFP1 to CKFPN is shown in the receiving portion 40A.

Figure 16:
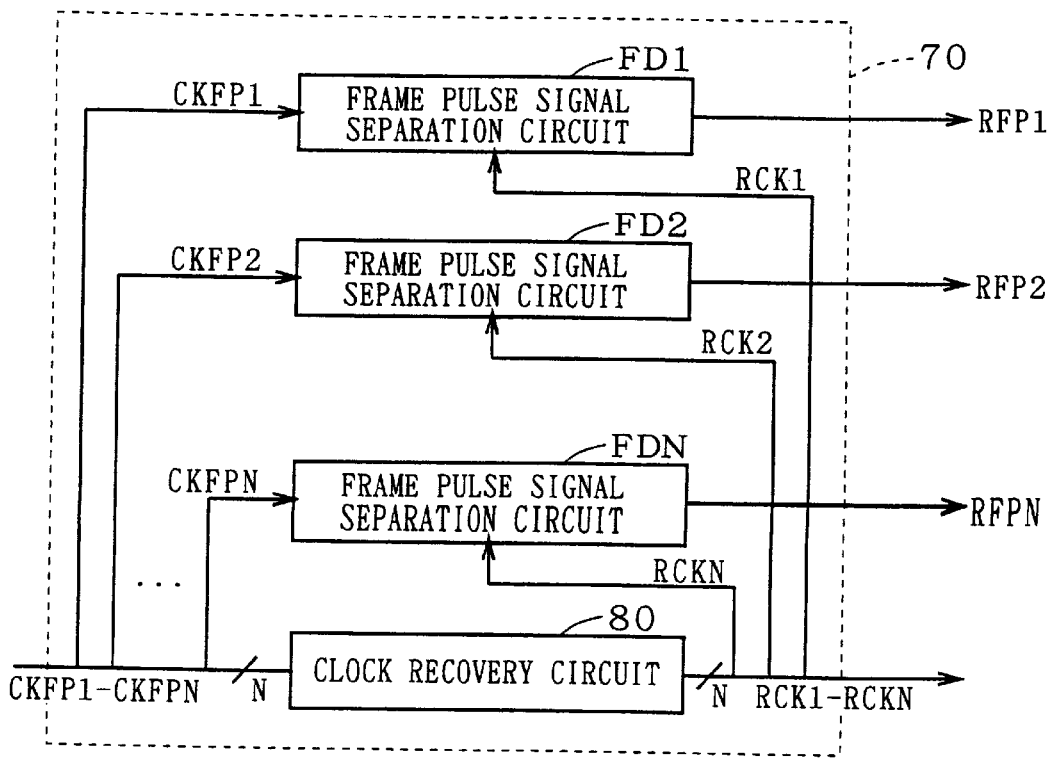
FIG. 16 is a block diagram of the signal separation circuit in the receiving portion shown in FIG. 15.

FIG. 16 is a block diagram showing an internal structure of the signal separation circuit 70. As shown, a clock recovery circuit 80 outputs the recovered clocks RCK1 to RCKN to the exterior and to frame pulse signal separation circuits FD1 to FEN, respectively, based on the multiple clocks CKFP1 to CKFPN.

The frame pulse signal separation circuits FD1 to FDN output the recovered frame pulse signals RFP1 to RFPN on the basis of the multiple clocks CKFP1 to CKFPN and the recovered clocks RCK1 to RCKN, respectively.

Figure 17:
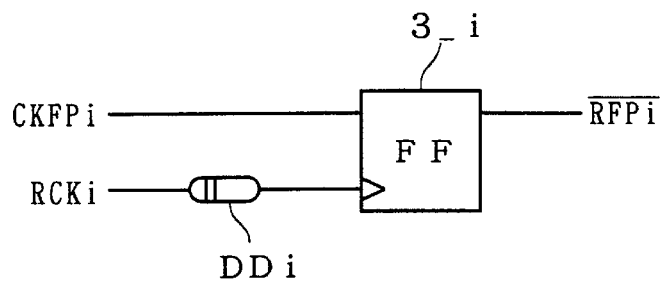
FIG. 17 is partial block diagram showing an internal structure of the frame pulse signal separation circuit shown in FIG. 16.
Figure 18:
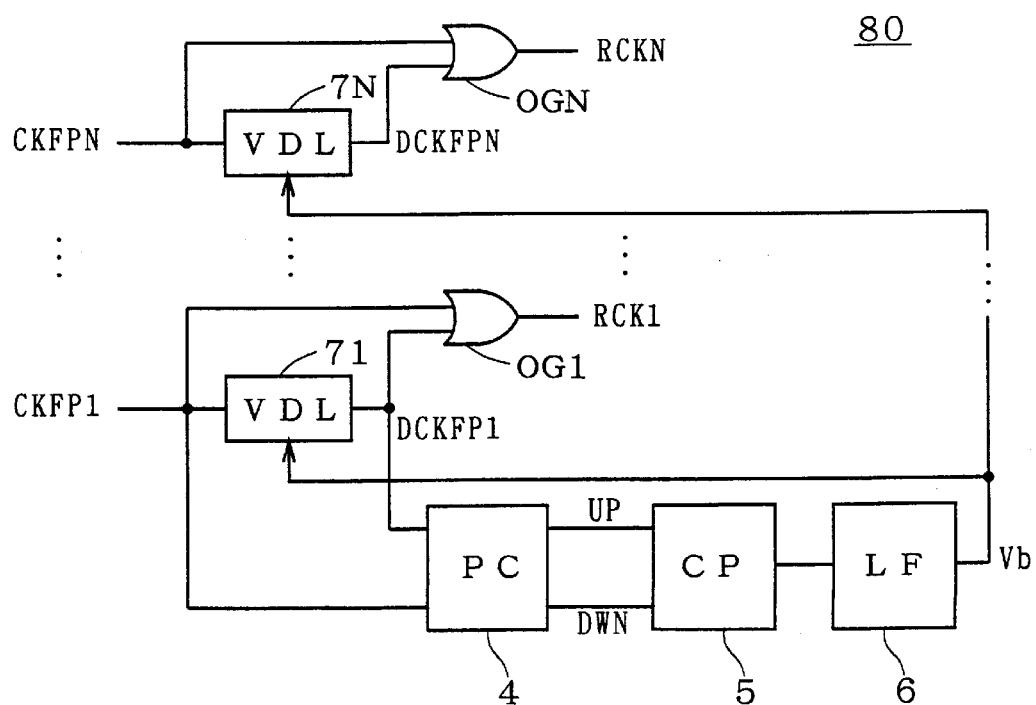
FIG. 18 is a block diagram showing an internal structure of the clock recovery circuit shown in FIG. 16.

With reference to FIG. 17, each frame pulse signal separation circuit FDi (i=1 to N), similar in internal construction to the frame pulse signal separation circuit 48 of the first preferred embodiment shown in FIG. 6, comprises a flip-flop 3_i and a delay line DDi. The flip-flop 3_i has a clock input for receiving the recovered clock RCKi through the delay line DDi, a data input for receiving the multiple clock CKFPi, and a data output for outputting an inverted recovered frame pulse signal $\overline{RFP}$. The time delay of the delay line DDi may be as short as not greater than a half period of the clock CK FIG. 18 is a block diagram showing an internal structure of the clock recovery circuit 80. As shown, the clock recovery circuit 80 comprises the phase comparator 4, the charge pump 5, the loop filter 6, variable delay lines 71 to 7N, and OR gates OGI to OGN.

The phase comparator 4 makes a comparison between the phase of the multiple clock CKFP1 and the phase of a delayed multiple clock DCKFP1 to output the up signal UP and the down signal DWN to the charge pump 5. The charge pump 5 applies the control voltage Vb through the loop filter 6 commonly to the variable delay lines 71 to 7N on the basis of the up signal UP and the down signal DWN.

The variable delay lines 71 to 7N provide time delays based on the control voltage Vb to the multiple clocks CKFP1 to CKFPN to output delayed multiple clocks DCKFP1 to DCKFPN, respectively. Each OR gate OG1 (i=1 to N) performs an OR operation on the multiple clock CKFPi and the delayed multiple clock DCKFPi to output the recovered clock RCKi.

In the clock recovery circuit 80 of the sixth preferred embodiment, the phase comparator 4, the charge pump 5, the loop filter 6, and the variable delay line 71 constitute a DLL which uses the control voltage Vb provided from the loop filter 6 to control the time delays of the variable delay lines 71 to 7N so that the multiple clock CKFP1 and the delayed multiple clock DCKFP1 are in phase. Thus, the delayed multiple clock DCKFPi lags correctly n clock periods nT (where n is a natural number) behind the multiple clock CKFPi.

Since the time delays are controlled, there is no problem in controlling the time delays of the variable delay lines 72 to 7N for generation of the delayed multiple clocks DCKFP2 to DCKFPN on the basis of the result of the phase comparison between the multiple clock CKFP1 and the delayed multiple clock DCKFP1.

Thus, ORing the multiple clock CKFPi and the delayed multiple clock DCKFPi which lags n clock periods behind the multiple clock CKFPi allows the delayed multiple clock DCKFPi to modify a time period over which the multiple clock CKFPi is held low for one clock period T or longer, achieving the correct reproduction of the recovered clock RCKi.

Additionally, one phase synchronization processing portion comprised of the phase comparator 4, the charge pump 5, and the loop filter 6 controls the time delays of the N variable delay lines 71 to 7N. This eliminates the need for (N−1) phase synchronization processing portions to achieve the significant simplification of the circuit arrangement and the reduction in power consumption.

It is desirable that the multiple clocks CKFP1 to CKFPN have the same frequency. However, when the frequency of a multiple clock CKFPj (j equals any one of 2 to N) is K times (K>0) the frequency of the multiple clock CKFP1 subjected to the phase comparison in the DLL, the time delay of the variable delay line 7j should be 1/K that of the variable delay line 71.

If the control input terminals of the variable delay lines 71 to 7N do not receive a bias voltage but a bias current, (N−1) current mirror circuits should be used to supply the variable delay lines 72 to 7N with the same amount of current as a current amount I1 to be supplied to the variable delay line 71.

Seventh Preferred Embodiment

Figure 19:
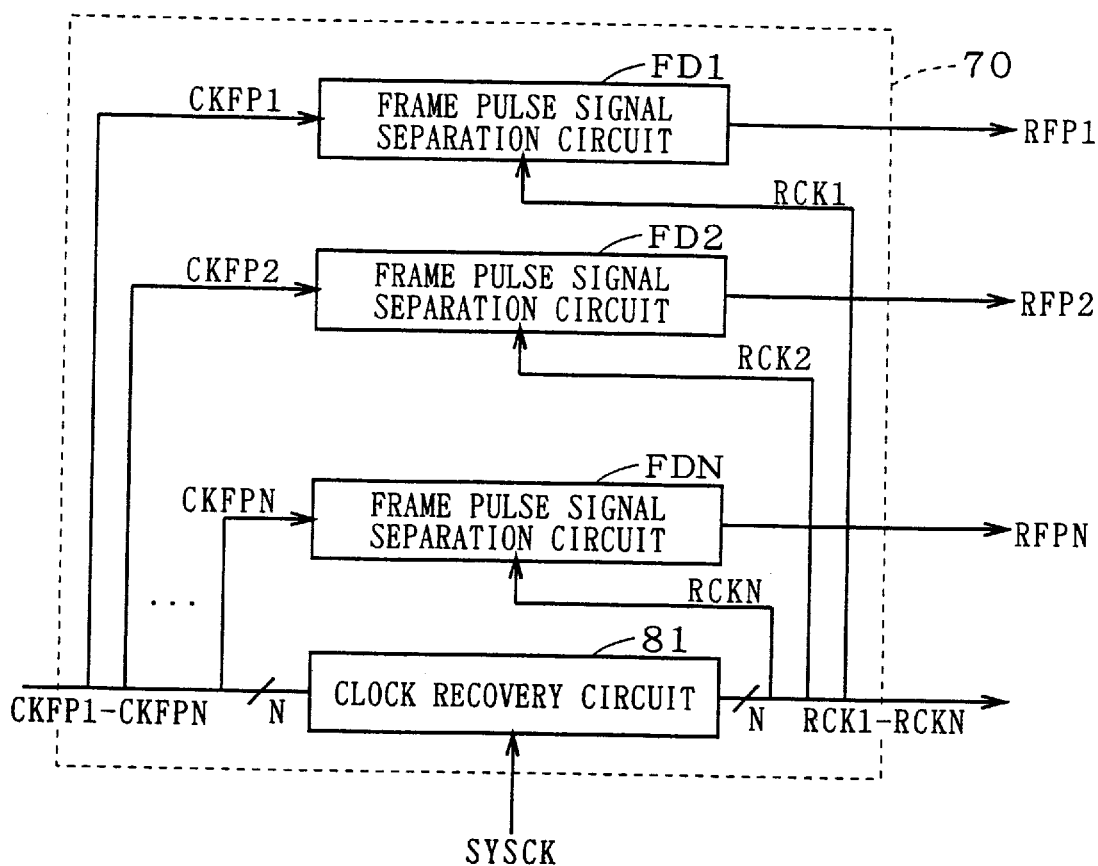
FIG. 19 is a block diagram of the signal separation circuit according to a seventh preferred embodiment of the present invention.

FIG. 19 is a block diagram showing an internal structure of the signal separation circuit 70 in the digital data transmission system according to a seventh preferred embodiment of the present invention. As shown, a clock recovery circuit 81 outputs the recovered clocks RCK1 to RCKN to the exterior and to the frame pulse signal separation circuits FD1 to FDN on the basis of a system clock SYSCK and the multiple clocks CKFP1 to CKFPN. The system of the seventh preferred embodiment is similar in general construction to that of the sixth preferred embodiment shown in FIG. 15.

The frame pulse signal separation circuits FD1 to FDN output the recovered frame pulse signals RFP1 to RFPN on the basis of the multiple clocks CKFP1 to CKFPN and the recovered clocks RCK1 to RCKN, respectively. Each frame pulse signal separation circuit FDi (i=1 to N) is similar in internal construction to that of the sixth preferred embodiment shown in FIG. 17.

Figure 20:
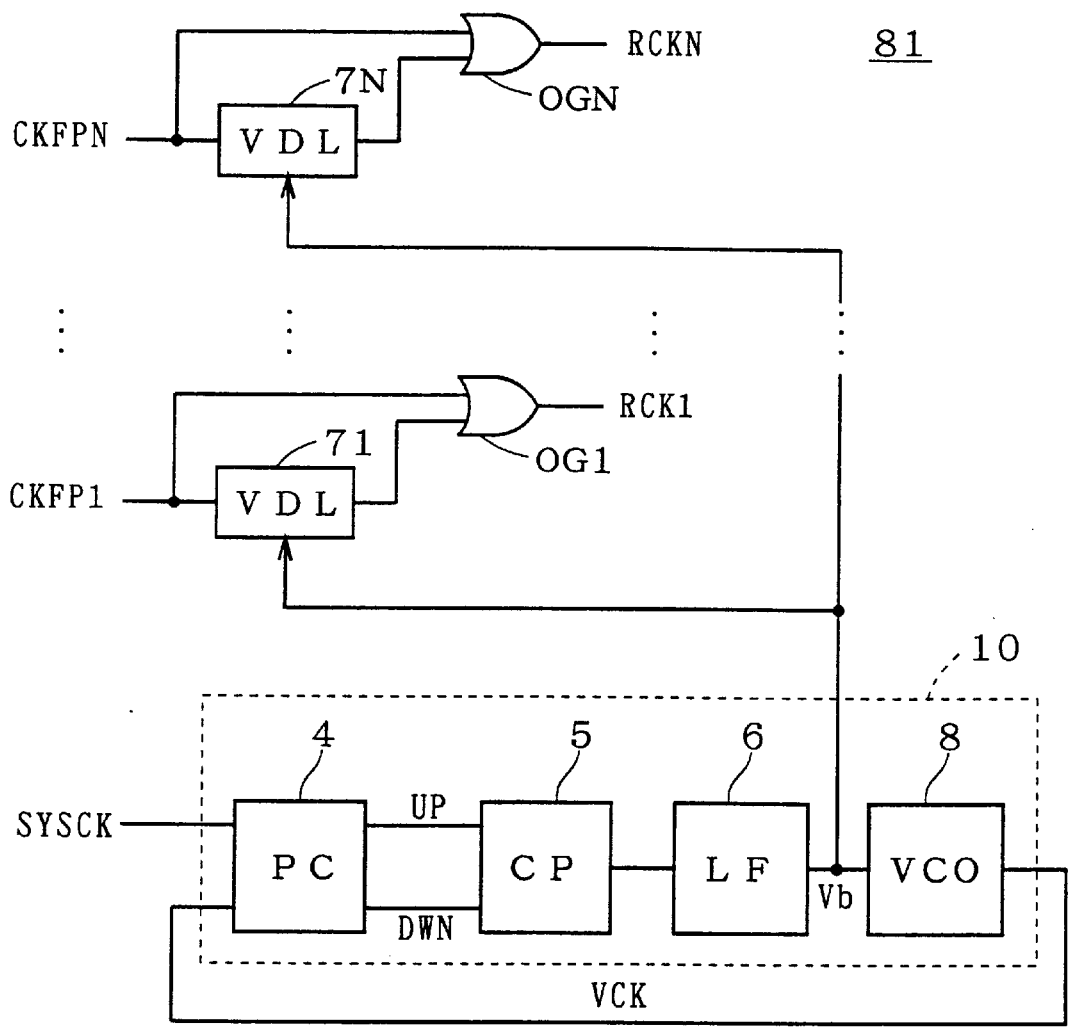
FIG. 20 is a block diagram showing an internal structure of the clock recovery circuit shown in FIG. 19.

FIG. 20 is a block diagram showing an internal structure of the clock recovery circuit 81. As shown, the clock recovery circuit 81 comprises a system PLL circuit 10 including the phase comparator 4, the charge pump 5, the loop filter 6 and the voltage-controlled oscillator 8; the variable delay lines 71 to 7N; and the OR gates OG1 to OGN.

The phase comparator 4 in the system PLL circuit 10 makes a comparison between the phase of an oscillation signal VCK outputted from the voltage-controlled oscillator 8 and the phase of the system clock SYSCK to output the up signal UP and the down signal DWN to the charge pump 5.

The charge pump 5 applies the control voltage Vb through the loop filter 6 commonly to the voltage-controlled oscillator 8 and the variable delay lines 71 to 7N on the basis of the up signal UP and the down signal DWN. The voltage-controlled oscillator 8 outputs the oscillation signal VCK at an oscillation frequency based on the control voltage Vb.

The variable delay lines 71 to 7N provide time delays of one clock period T based on the control voltage Vb to the multiple clocks CKFP1 to CKFPN to provide the delayed multiple clocks DCKFP1 to DCKFPN, respectively.

Each OR gate OGi (i=1 to N) performs an OR operation on the multiple clock CKFPi and the delayed multiple clock DCKFPi to output the recovered clock RCKi.

In the clock recovery circuit 81 of the seventh preferred embodiment, the PLL comprised of the phase comparator 4, the charge pump 5, the loop filter 6, and the voltage-controlled oscillator 8 outputs the control voltage Vb from the loop filter 6 so that the system clock SYSCK and the oscillation signal VCK are in phase. Thus, the delayed multiple clock DCKFPi lags correctly one clock period T behind the multiple clock CKFPi.

Since the time delays are controlled, there is no problem in controlling the time delays of the variable delay lines 71 to 7N for generation of the delayed multiple clocks DCKFP1 to DCKFPN on the basis of the result of the phase comparison between the system clock SYSCK and the oscillation signal VCK from the voltage-controlled oscillator 8.

Thus, ORing the multiple clock CKFPi and the delayed multiple clock DCKFPi which lags one clock period behind the multiple clock CKFPi allows the delayed multiple clock DCKFPi to modify a time period over which the multiple clock CKFPi is held low for one clock period T or longer, achieving the correct reproduction of the recovered clock RCKi.

Additionally, the single system PLL circuit 10 comprised of the phase comparator 4, the charge pump 5, the loop filter 6, and the voltage-controlled oscillator 8 controls the time delays of the N variable delay lines 71 to 7N. This eliminates the need for (N−1) PLL circuit portions to achieve the significant simplification of the circuit arrangement and the reduction in power consumption.

Further, the system clock SYSCK used as a reference signal for the phase comparison in the system PLL circuit 10 is independent of the multiple clocks CKFP1 to CKFPN and is not multiplexed with the frame pulse signal FP. Thus, the system PLL circuit 10 is reliably locked at an early stage without malfunctions.

It is desirable that the system clock SYSCK and the multiple clocks CKFP1 to CKFPN have the same frequency. However, when the frequency of a multiple clock CKFPj (j equals any one of 1 to N) is K times (K>0) the frequency of the system clock SYSCK, the voltage-controlled oscillator 8 and the variable delay lines 71 to 7N should be constructed by identical delay elements, and the number of delay stages of the variable delay line 7j should be 1/K that of the voltage-controlled oscillator 8.

If the control input terminals of the variable delay lines 71 to 7N do not receive a bias voltage but a bias current, N current mirror circuits should be used to supply the variable delay lines 71 to 7N with the same amount of current as the amount of control current from the system PLL circuit 10.

Furthermore, the arrangement of the clock recovery circuit 81 of the seventh preferred embodiment where N=1 may be used in place of the clock recovery circuit 47 of the fifth preferred embodiment shown in FIG. 13.

Eighth Preferred Embodiment

Figure 21:
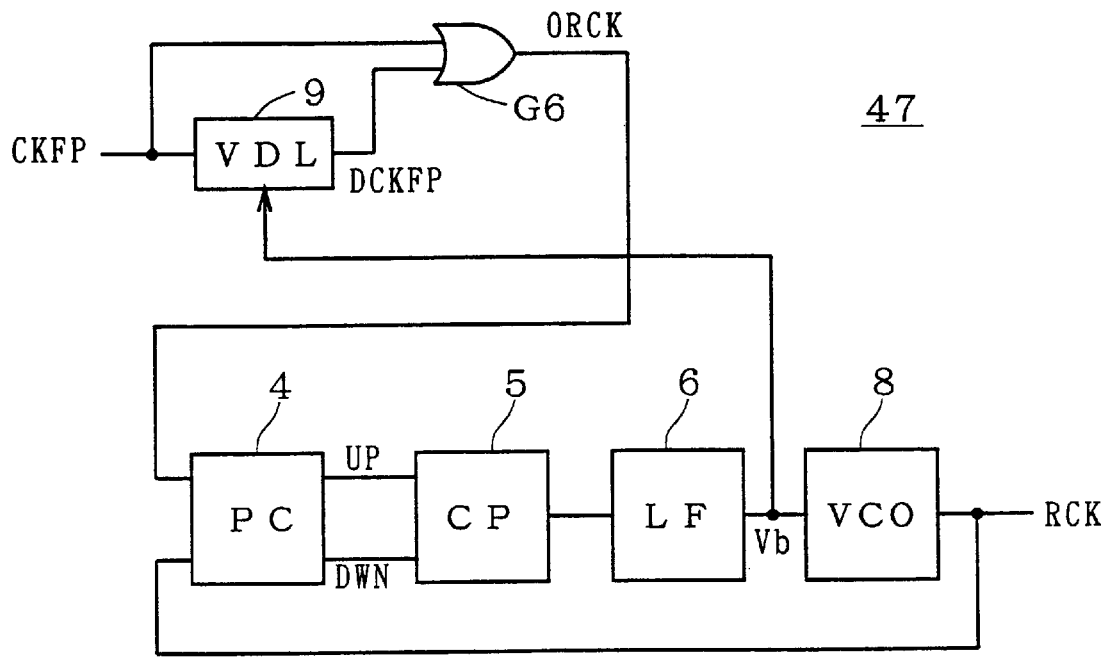
FIG. 21 is a block diagram showing an internal structure of the clock recovery circuit according to an eighth preferred embodiment of the present invention.

FIG. 21 is a block diagram showing an internal structure of the clock recovery circuit 47 in the digital data transmission system according to an eighth preferred embodiment of the present invention. The general structure of the eighth preferred embodiment is similar to that of the first preferred embodiment shown in FIG. 1. The signal separation circuit 46 of the eighth preferred embodiment is similar in construction to that of the first preferred embodiment shown in FIG. 5.

Referring to FIG. 21, the clock recovery circuit 47 comprises a PLL circuit including the phase comparator 4, the charge pump 5, the loop filter 6, and the voltage-controlled oscillator 8.

The phase comparator 4 makes a comparison between the phase of a clock ORCK outputted from an OR gate G6 and the phase of the recovered clock RCK to output the up signal UP and the down signal DWN to the charge pump 5. The charge pump 5 applies the control voltage Vb through the loop filter 6 to the voltage-controlled oscillator 8 on the basis of the up signal UP and the down signal DWN. The voltage-controlled oscillator 8 outputs the recovered clock RCK which oscillates at a frequency based on the control voltage Vb.

The control voltage Vb outputted from the loop filter 6 is also applied to a variable delay line 9. The variable delay line 9 provides a time delay based on the control voltage Vb to the multiple clock CKFP to output the delayed multiple clock DCKFP. The OR gate G6 performs an OR operation on the multiple clock CKFP and the delayed multiple clock DCKFP to output the clock ORCK.

The voltage-controlled oscillator 8 comprises a ring oscillator including K inverters (delay elements) (where K is an odd number). The time delay of the variable delay line 9 including K in-series connected inverters like the voltage-controlled oscillator 8 becomes equal to one clock period of the recovered clock. Then, the waveform of the clock ORCK becomes substantially similar to that of the clock CK.

When the PLL synchronizes the clock ORCK and the recovered clock RCK, the recovered clock RCK which is a substantially correct reproduction of the clock CK is outputted.

Additionally, the multiple clock CKFP is not directly used for the phase comparison in the PLL. Thus, the PLL is reliably locked at an early stage without malfunctions.

If the control input terminal of the variable delay line 9 does not receive a bias voltage but a bias current, a current mirror circuit should be used to supply the variable delay line 9 with the same amount of current as the amount of current into which the control voltage Vb is converted.

Ninth Preferred Embodiment

Figure 22:
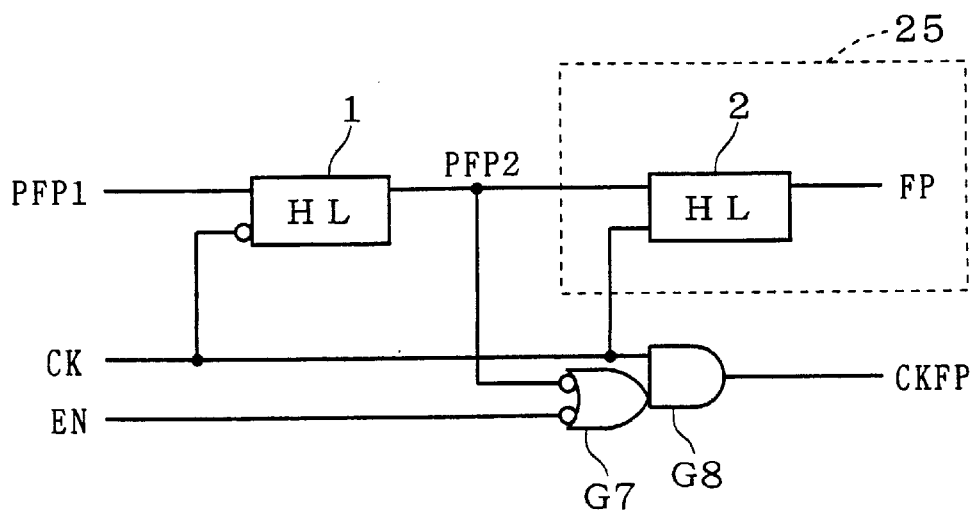
FIG. 22 is a circuit diagram showing an internal structure of the clock multiplexing circuit according to a ninth preferred embodiment of the present invention.

FIG. 22 is a circuit diagram of the clock multiplexing circuit 36 in the digital data transmission system according to a ninth preferred embodiment of the present invention.

The clock multiplexing circuit 36 of the ninth preferred embodiment comprises the half latches 1 and 2, an OR gate G7, and an AND gate G8. For purposes of explanation, the frame pulse signal FP a half clock period (T/2) earlier is referred to as the preliminary frame pulse signal PFP2, and the frame pulse signal FP one clock period (T) earlier is referred to as the preliminary frame pulse signal PFP1.

The half latch 1 receives the preliminary frame pulse signal PFP1 and the inverted version of the clock CK. When the clock CK is low, the half latch 1 is in a through state wherein the preliminary frame pulse signal PFP1 is outputted intactly as the preliminary frame pulse signal PFP2. When the clock CK is high, the half latch 1 is in a latch state wherein an immediately preceding output value of the preliminary frame pulse signal PFP1 is outputted as the preliminary frame pulse signal PFP2.

The half latch 2 receives the preliminary frame pulse signal PFP2 and the clock CK When the clock CK is high, the half latch 2 is in a through state wherein the preliminary frame pulse signal PFP2 is outputted intactly as the frame pulse signal FP. When the clock CK is low, the half latch 2 is in a latch state wherein an immediately preceding output value of the preliminary frame pulse signal PFP2 is outputted as the frame pulse signal FP.

The OR gate G7 receives an inverted version of an enable signal EN and the inverted version of the preliminary frame pulse signal PFP2. Upon receipt of the clock CK and the output from the OR gate G7, the AND gate G8 performs an AND operation on the clock CK and the output from the OR gate G7 to output the multiple clock CKFP.

Figure 23:
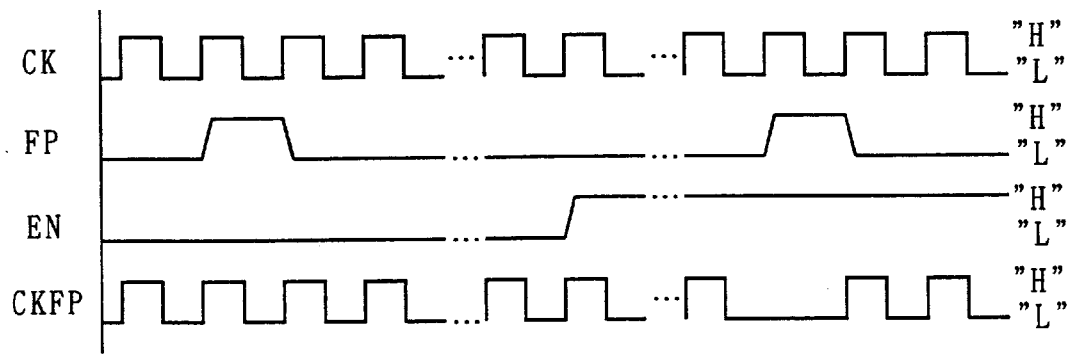
FIG. 23 is a timing chart showing the operation of the clock multiplexing circuit of FIG. 22.

FIG. 23 is a timing chart showing the multiplexing operation of the clock multiplexing circuit 36 of the ninth preferred embodiment. As shown, when the enable signal EN is low, the output from the OR gate G7 is fixed high, and the clock CK is outputted intactly as the multiple clock CKFP. That is, the function of multiplexing the frame pulse signal FP in the clock multiplexing circuit 36 is disabled.

When the enable signal EN is high, on the other hand, a signal corresponding to the clock CK which is masked (fixed low) during the time the frame pulse signal FP is active (during the time the frame pulse signal FP is high) is outputted as the multiple clock CKFP.

In this manner, the clock multiplexing circuit 36 of the ninth preferred embodiment is based on the enable signal EN to suitably select as the multiple clock CKFP either the clock CK or the signal provided by multiplexing the frame pulse signal FP and the clock CK together.

For example, holding the enable signal EN low to output the clock CK as the multiple clock CKFP until the PLL or DLL in the clock recovery circuit 47 of the receiving portion 40 is locked prevents the malfunctions of the PLL (DLL) at a frame pulse signal position of the multiple clock CKFP, permitting the PLL (DLL) to be reliably locked at an early stage. After the PLL or DLL is reliably locked, the enable signal EN should be made high to output the multiple clock CKFP which is the result of the actual multiplexing.

The clock multiplexing circuit 36 is required to output only the multiple clock CKFP. If the clock multiplexing circuit 36 need not output the frame pulse signal FP, the half latch 2 is not required in practice, and the clock multiplexing circuit 36 may be comprised of only the half latch 1, the OR gate G7, and the AND gate G8. The portion 25 which is not required may be dispensed with.

Tenth Preferred Embodiment

Figure 24:
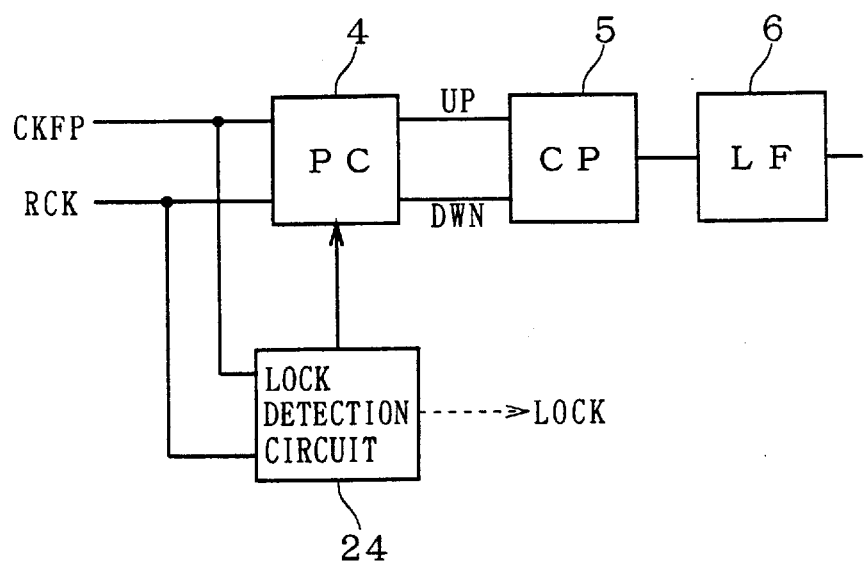
FIG. 24 is a partial block diagram showing an internal structure of the clock recovery circuit according to a tenth preferred embodiment of the present invention.

FIG. 24 is a block diagram showing an internal structure of the clock recovery circuit 47 (47A) according to a tenth preferred embodiment of the present invention. As shown, the clock recovery circuit 47 (47A) comprises a lock detection circuit 24 in addition to the PLL or DLL. The lock detection circuit 24 detects two input signals to the phase comparator 4 to detect whether or not the PLL or DLL is locked. Upon detection of the locked state, the lock detection circuit 24 forces the phase comparator 4 to stop the phase comparison.

Such an arrangement prevents the malfunctions of the PLL (DLL) at the frame pulse signal position of the multiple clock CKFP after the PLL or DLL is locked. In this case, it is not necessary to provide a masking circuit using the inverted recovered frame pulse signal $\overline{RFP}$ which is described in the second to fourth preferred embodiments.

Figure 25:
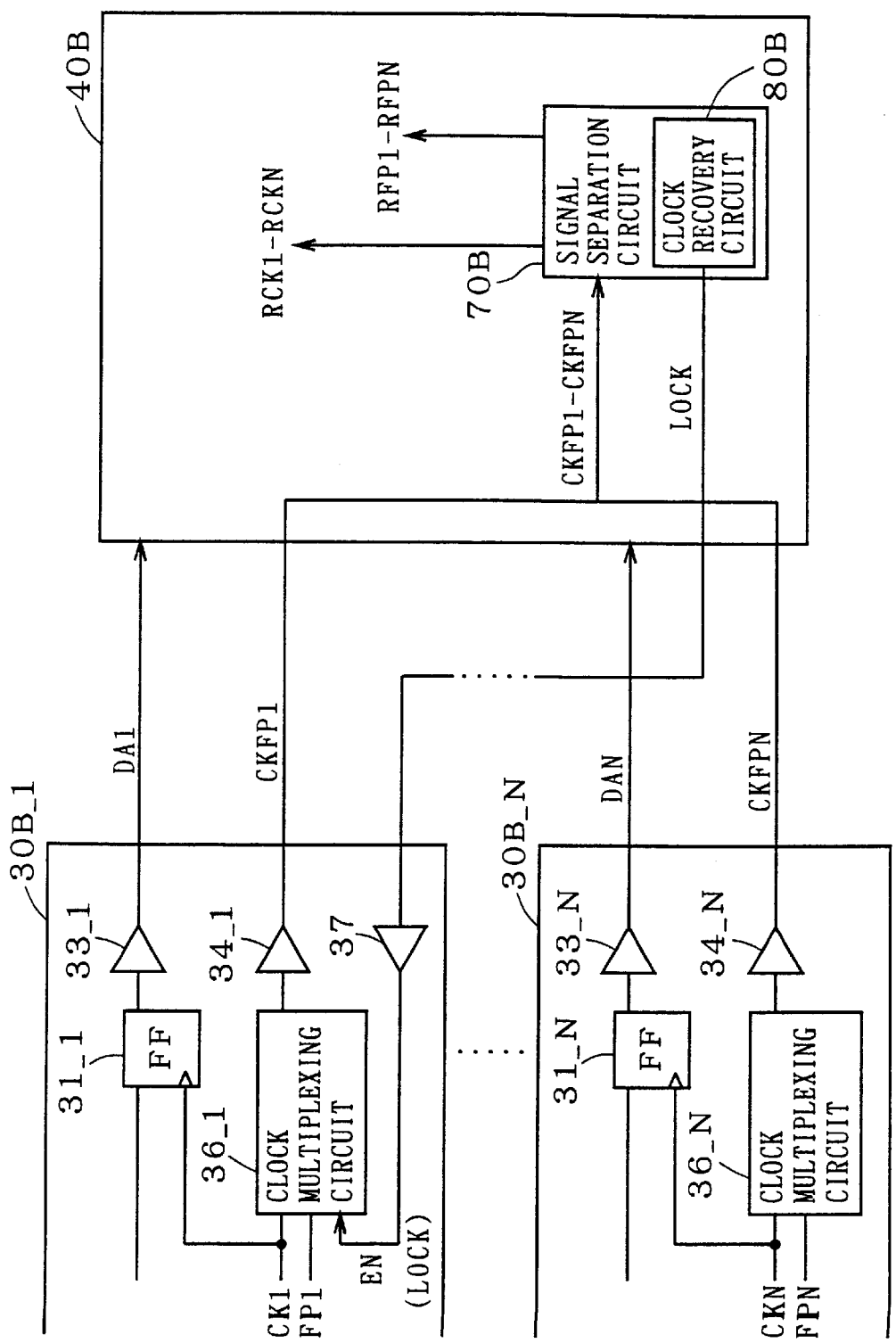
FIG. 25 is a block diagram showing a first application of the tenth preferred embodiment.

As indicated by the broken arrow of FIG. 24, a lock detection signal LOCK which is high when the PLL or DLL is locked and which is low when unlocked may be outputted to the exterior so that other external components may use the lock detection signal LOCK FIG. 25 is a block diagram of a first application of the clock recovery circuit according to the tenth preferred embodiment. As shown, N transmitting portions 30B_1 to 30B_N comprise flip-flops 31_1 to 31_N for outputting the data DA1 to DAN through drivers 33_1 to 33_N provided therein, and clock multiplexing circuits 36_1 to 36_N for outputting the multiple clocks CKFP1 to CKFPN through drivers 34_1 to 34_N provided therein, respectively. A receiving portion 40B receives all of the outputs from the transmitting portions 30B_1 to 30B_N.

A signal separation circuit 70B in the receiving portion 40B reproduces the recovered clocks RCK1 to RCKN and the recovered frame pulse signals RFP1 to RFPN from the multiple clocks CKFP1 to CKFPN, and outputs the lock detection signal LOCK to the transmitting portion 30B_1. The receiving portion 40B, similar in internal construction to the receiving portion 40 shown in FIG. 1, comprises flip-flops for processing the data DA1 to DAN and operating in synchronism with the recovered clocks RCK1 to RCKN, respectively. For purposes of explanation, only a characteristic portion associated with the separation of the multiple clocks CKFP1 to CKFPN is shown in the receiving portion 40B.

The signal separation circuit 70B is similar in internal construction to the signal separation circuit 70 of the sixth preferred embodiment shown in FIG. 16. A clock recovery circuit 80B comprises the lock detection circuit 24 shown in FIG. 24 in addition to the components of the clock recovery circuit 80 of the sixth preferred embodiment shown in FIG. 18. The clock recovery circuit 80B outputs the lock detection signal LOCK to the transmitting portion 30B_1.

The clock multiplexing circuit 36_1 of the transmitting portion 30B_1 is similar in construction to the clock multiplexing circuit of the ninth preferred embodiment shown in FIG. 22. The clock multiplexing circuit 36_1 has an enable function of multiplexing the frame pulse signal FP1 and the clock CK1 together to output the multiple clock CKFP1 when the enable signal EN is high, and outputting the clock CK1 intactly as the multiple clock CKFP1 when the enable signal EN is low. The clock multiplexing circuits 36_2 to 36_N of the transmitting portions 30B_2 to 30B_N, similar in construction to the clock multiplexing circuit of the first preferred embodiment shown in FIG. 2, multiplex the frame pulse signals FP2 to FPN and the clocks CK2 to CKN together to output the multiple clocks CKFP2 to CKFPN respectively, but do not have the enable function.

The clock multiplexing circuit 36_1 of the transmitting portion 30B_1 receives the lock detection signal LOCK as the enable signal EN through a driver 37. Then, the clock multiplexing circuit 36_1 multiplexes the frame pulse signal FP1 and the clock CK1 together to output the multiple clock CKFP1 when the lock detection signal LOCK is high (in the locked state), and outputs the clock CK1 intactly as the multiple clock CKFP1 when the lock detection signal LOCK is low (in the unlocked state).

In the first application shown in FIG. 25, the clock recovery circuit 80B receives the clock CK1 as the multiple clock CKFP1 until the DLL provided therein is locked. Because of no multiplexing of the frame pulse FP1 with the clock CK1, the DLL is prevented from malfunctioning and reliably locked at an early stage.

After the DLL of the clock recovery circuit 80B is locked (the lock detection signal LOCK goes high), the clock recovery circuit 80B receives the actual multiple clock CKFP1 provided by multiplexing the frame pulse signal FP1 and the clock CK1 from the clock multiplexing circuit 36_1.

In the first application, outputting the lock detection signal LOCK from the receiving portion 40B to the transmitting portion 30B_1 requires the addition of one signal line. However, required is the addition of only one signal line for the structure comprising the N transmitting portions 30B_1 to 30B_N and the receiving portion 40B, which is less burdensome.

Figure 26:
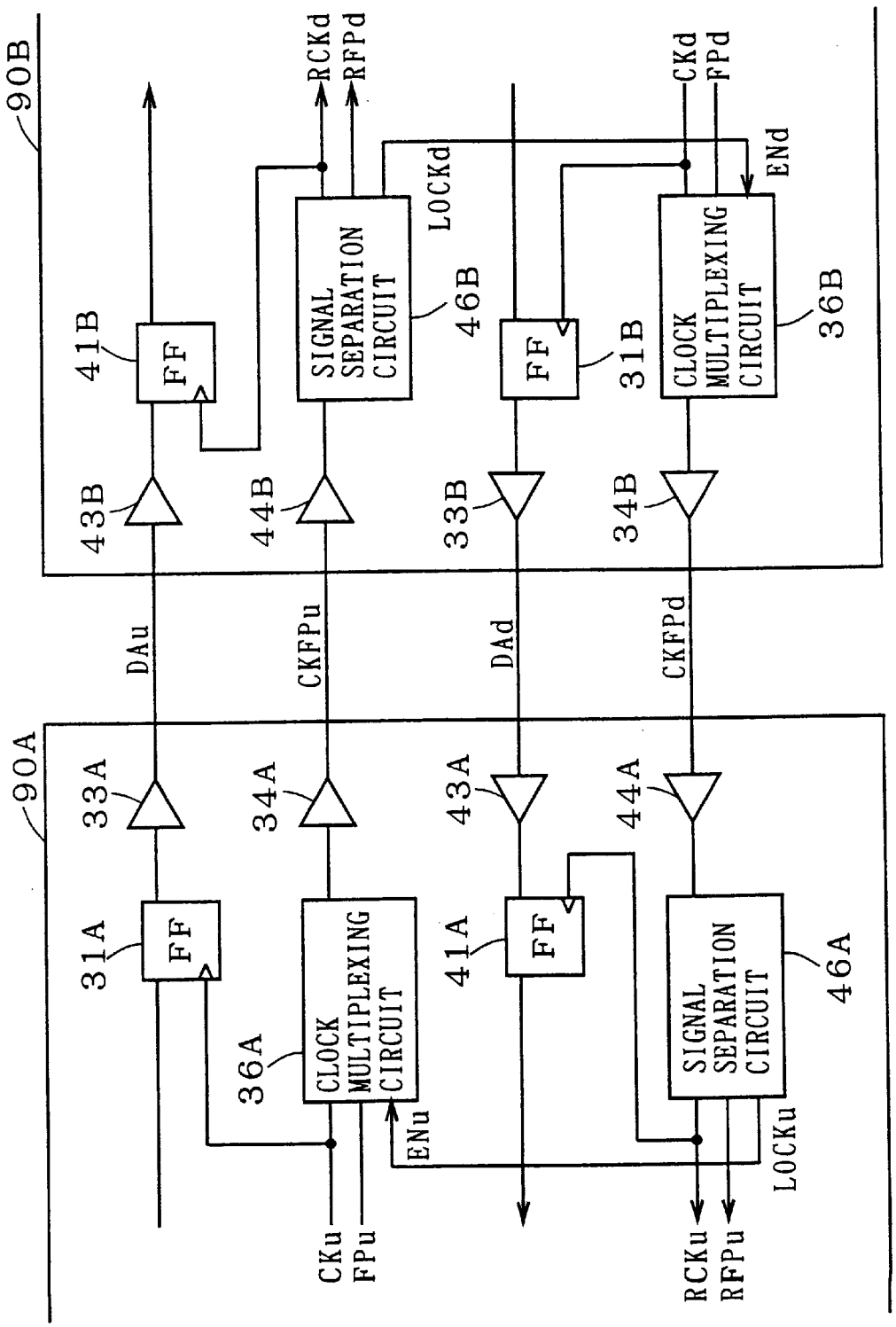
FIG. 26 is a block diagram showing a second application of the tenth preferred embodiment.

FIG. 26 is a block diagram of a second application of the tenth preferred embodiment. As shown, the second application is based on the data transmission system comprising transmitting and receiving portions 90A and 90B each having a transmitting and receiving function.

A clock multiplexing circuit 36A in the transmitting and receiving portion 90A transmits a multiple clock CKFPu through a driver 34A to the transmitting and receiving portion 90B. A flip-flop 31A in the transmitting and receiving portion 90A transmits data DAu through a driver 33A to the transmitting and receiving portion 90B. Likewise, a clock multiplexing circuit 36B in the transmitting and receiving portion 90B transmits a multiple clock CKFPd through a driver 34B to the transmitting and receiving portion 90A. A flip-flop 31B in the transmitting and receiving portion 90B transmits data DAd through a driver 33B to the transmitting and receiving portion 90A.

A signal separation circuit 46A in the transmitting and receiving portion 90A receives the multiple clock CKFPd through a driver 44A to separate a recovered clock RCKd and a recovered frame pulse signal RFPd on the basis of the multiple clock CKFPd. A flip-flop 41A in the transmitting and receiving portion 90A receives the data DAd through a driver 43A to perform signal processing on the data DAd in synchronism with the recovered clock RCKd. Likewise, a signal separation circuit 46B in the transmitting and receiving portion 90B receives the multiple clock CKFPu through a driver 44B to separate a recovered clock RCKu and a recovered frame pulse signal RFPu on the basis of the multiple clock CKFPu. A flip-flop 41B in the transmitting and receiving portion 90B receives the data DAu through a driver 43B to perform signal processing on the data DAu in synchronism with the recovered clock RCKu.

The clock multiplexing circuit 36A of the transmitting and receiving portion 90A, similar in construction to the clock multiplexing circuit of the ninth preferred embodiment shown in FIG. 22, multiplexes a frame pulse signal FPu and a clock CKu together to output the multiple clock CKFPu when an enable signal ENu is high, and outputs the clock CKu intactly as the multiple clock CKFPu when the enable signal ENu is low.

The clock multiplexing circuit 36B of the transmitting and receiving portion 90B, also similar in construction to the clock multiplexing circuit of the ninth preferred embodiment shown in FIG. 22, multiplexes a frame pulse signal FPd and a clock CKd together to output the multiple clock CKFPd when an enable signal ENd is high, and outputs the clock CKd intactly as the multiple clock CKFPd when the enable signal ENd is low. The clocks CKu and CKd have the same frequency.

The signal separation circuit 46A of the transmitting and receiving portion 90A comprises a clock recovery circuit and a frame pulse separation circuit as shown in FIG. 4. The clock recovery circuit may be of any one of the constructions illustrated in the first to fifth, and eighth preferred embodiments. The clock recovery circuit, however, comprises the lock detection circuit 24 shown in FIG. 24 in addition to the synchronization loop circuit, that is, the PLL or DLL circuit. A lock detection signal LOCKu from the lock detection circuit 24 is outputted as the enable signal ENu for the clock multiplexing circuit 36A. The frame pulse separation circuit has a construction shown in FIG. 6.

The signal separation circuit 46B of the transmitting and receiving portion 90B also comprises a clock recovery circuit and a frame pulse separation circuit as shown in FIG. 4. The clock recovery circuit may be of any one of the constructions illustrated in the first to fifth, and eighth preferred embodiments. The clock recovery circuit, however, comprises the lock detection circuit 24 shown in FIG. 24 in addition to the synchronization loop circuit. A lock detection signal LOCKd from the lock detection circuit 24 is outputted as the enable signal ENd for the clock multiplexing circuit 36B. The frame pulse separation circuit has a construction shown in FIG. 6.

Since the synchronization loops (PLLs or DLLs) of the recovery circuits of the signal separation circuits 46A and 46B are similar in construction and the clocks CKu and CKd have the same period, both of the synchronization loops are locked substantially at the same time. Therefore, the transmitting and receiving portions 90A and 90B may detect whether the synchronization loops of signal separation circuits 46A and 46B provided therein are locked or unlocked to estimate the time when the synchronization loops of the signal separation circuits 46B and 46A serving as the receiving end are locked, thereby changing the contents of the multiple clocks CKFPu and CKFPd to be outputted from the clock multiplexing circuits 36A and 36B, respectively.

In the second application shown in FIG. 26, the clock multiplexing circuit 36A of the transmitting and receiving portion 90A outputs the clock CKu as the multiple clock CKFPu until the synchronization loop in the signal separation circuit 46A is locked (the lock detection signal LOCKu goes high), that is, it is estimated that the synchronization loop in the signal separation circuit 46B of the transmitting and receiving portion 90B has been locked. The signal separation circuit 46B of the transmitting and receiving portion 90B may prevent the malfunctions of the synchronization loop in the clock recovery circuit therein and allows the synchronization loop to be reliably locked at an early stage.

After it is estimated that the synchronization loop of the clock recovery circuit in the signal separation circuit 46B has been locked (the lock detection signal LOCKu from the signal separation circuit 46A goes high), the clock multiplexing circuit 36A outputs to the transmitting and receiving portion 90B the actual multiple clock CKFPu provided by multiplexing the frame pulse signal FPu and the clock CKu.

Likewise, the clock multiplexing circuit 36B of the transmitting and receiving portion 90B outputs the clock CKd as the multiple clock CKFPd until the synchronization loop in the signal separation circuit 46B is locked (the lock detection signal LOCKd goes high), that is, it is estimated that the synchronization loop in the signal separation circuit 46A of the transmitting and receiving portion 90A has been locked. The signal separation circuit 46A of the transmitting and receiving portion 90A may prevent the malfunctions of the synchronization loop in the clock recovery circuit therein and allows the synchronization loop to be reliably locked at an early stage.

After it is estimated that the synchronization loop of the clock recovery circuit in the signal separation circuit 46A has been locked (the lock detection signal LOCKd from the signal separation circuit 46B goes high), the clock multiplexing circuit 36B outputs to the transmitting and receiving portion 90A the actual multiple clock CKFPd provided by multiplexing the frame pulse signal FPd and the clock CKd.

In the second application, each of the transmitting and receiving portions 90A and 90B estimates the locked/unlocked state of the synchronization loop of the multiple clock receiving end to change the contents of the multiple clock on the basis of the lock detection signal of the synchronization loop therein. Therefore, the second application is effective in eliminating the need for an external signal line which is provided in the first application.

Eleventh Preferred Embodiment

Figure 27:
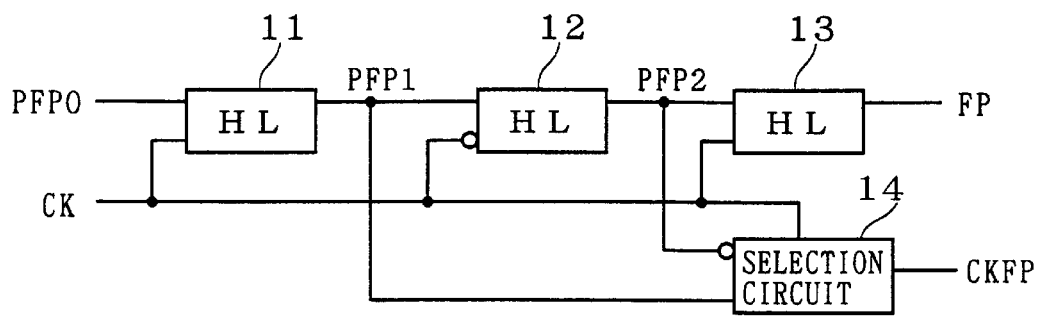
FIG. 27 is a circuit diagram showing an internal structure of the clock multiplexing circuit according to an eleventh preferred embodiment of the present invention.

FIG. 27 is a circuit diagram showing as internal structure of the clock multiplexing circuit in the digital data transmission system according to an eleventh preferred embodiment of the present invention. The general structure of the eleventh preferred embodiment is similar to that of the first preferred embodiment shown in FIG. 1.

For purposes of explanation, the frame pulse signal FP a half clock period (T/2) earlier is referred to as the preliminary frame pulse signal PFP2, the frame pulse signal FP one clock period (T) earlier is referred to as the preliminary frame pulse signal PFP1, and the frame pulse signal FP one and one-half clocks (1.5T) earlier is referred to as a preliminary frame pulse signal PFPO.

A half latch 11 receives the preliminary frame pulse signal PFPO and the clock CK. When the clock CK is high, the half latch 11 is in a through state wherein the preliminary frame pulse signal PFPO is outputted intactly as the preliminary frame pulse signal PFP1. When the clock CK is low, the half latch 11 is in a latch state wherein an immediately preceding output value of the preliminary frame pulse signal PFPO is outputted as the preliminary frame pulse signal PFP1.

A half latch 12 receives the preliminary frame pulse signal PFP1 and the inverted version of the clock CK. When the clock CK is low, the half latch 12 is in a through state wherein the preliminary frame pulse signal PFP1 is outputted intactly as the preliminary frame pulse signal PFP2. When the clock CK is high, the half latch 12 is in a latch state wherein an immediately preceding output value of the preliminary frame pulse signal PFP1 is outputted as the preliminary frame pulse signal PFP2.

A half latch 13 receives the preliminary frame pulse signal PFP2 and the clock CK. When the clock CK is high, the half latch 13 is in a through state wherein the preliminary frame pulse signal PFP2 is outputted intactly as the frame pulse signal FP. When the clock CK is low, the half latch 13 is in a latch state wherein an immediately preceding output value of the preliminary frame pulse signal PFP2 is outputted as the frame pulse signal FP.

A selection circuit 14 receives the preliminary frame pulse signal PFP1, an inverted version of the preliminary frame pulse signal PFP2, and the clock CK. When the clock CK is high, the selection circuit 14 outputs the inverted version of the preliminary frame pulse signal PFP2 as the multiple clock CKFP. When the clock CK is low, the selection circuit 14 outputs the preliminary frame pulse signal PFP1 as the multiple clock CKFP.

Figure 28:
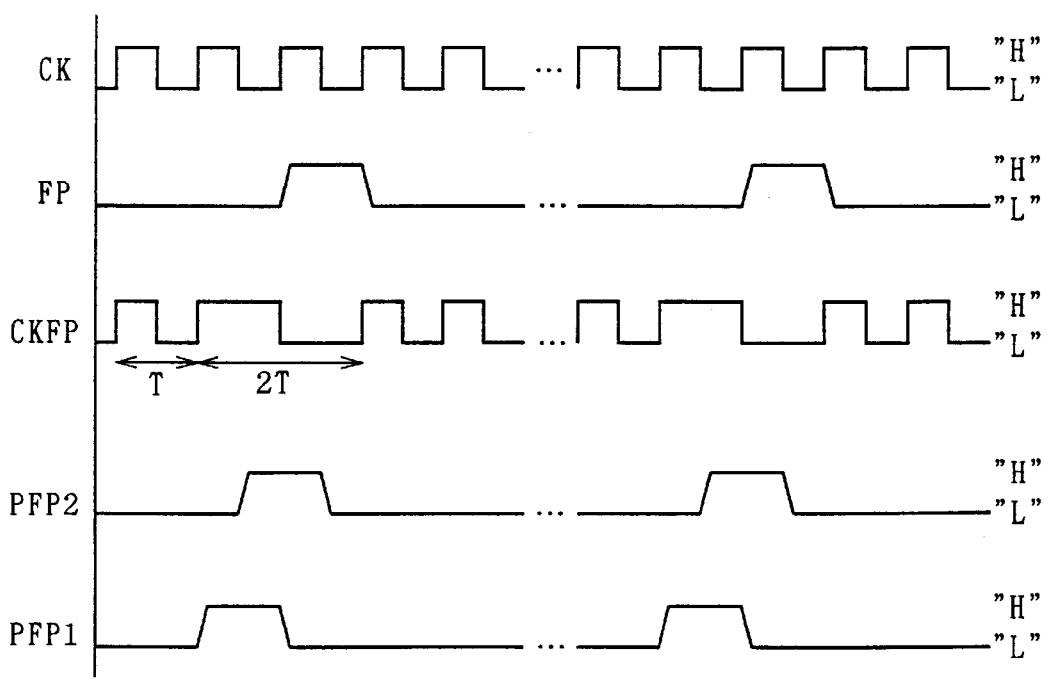
FIG. 28 is a timing chart showing the operation of the clock multiplexing circuit of FIG. 27.

FIG. 28 is a timing chart showing the multiplexing operation of the clock multiplexing circuit 36 according to the eleventh preferred embodiment. As shown, when the clock CK and the frame pulse signal FP (preliminary frame pulse signals PFP1 and PFP2) are generated, the multiple clock CKFP is outputted which has a period (2T) twice the normal period of the multiple clock CKFP during the time the frame pulse signal FP is active.

Thus, the multiple clock CKFP generated by the clock multiplexing circuit 36 of the eleventh preferred embodiment has a DC valance and a transmission characteristic which are better than those of the multiple clock generated by a multiplexing method which causes a missing clock pulse.

Like the clock multiplexing circuit 36 of the ninth preferred embodiment shown in FIG. 22, the clock multiplexing circuit 36 of the eleventh preferred embodiment may control the enabling/disabling of the multiplexing of the frame pulse signal FP using the enable signal EN to output the multiple clock CKFP.

The signal separation circuit 46 of the eleventh preferred embodiment may be similar in construction to that of the first preferred embodiment shown in FIG. 4. That is, the frame pulse signal separation circuit 48 of the first preferred embodiment shown in FIG. 6 is capable of reproducing the frame pulse signal FP from the multiple clock CKFP generated by the clock multiplexing circuit 36 of the eleventh preferred embodiment. The clock recovery circuit 47 of the eleventh preferred embodiment may have the circuit construction of the first preferred embodiment shown in FIG. 5.

The signal separation circuit 46 may be of the construction of the second to fourth preferred embodiments shown in FIG. 8. In this case, the malfunction prevention circuit of the second, third, and fourth preferred embodiments shown in FIGS. 9, 11, and 12 may be applied to the clock recovery circuit 47.

Twelfth Preferred Embodiment

Figure 29:
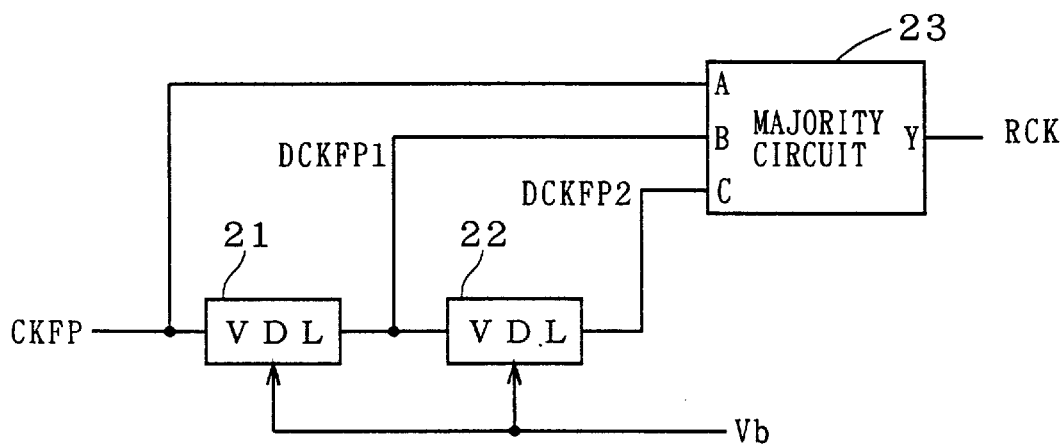
FIG. 29 is a partial block diagram showing an internal structure of the clock recovery circuit according to a twelfth preferred embodiment of the present invention.

FIG. 29 is a partial circuit diagram showing an internal structure of the clock recovery circuit 47 in the digital data transmission system according to a twelfth preferred embodiment of the present invention.

A variable delay line 21 provides a time delay of n clock periods to the multiple clock CKFP to output the delayed multiple clock DCKFP1. A variable delay line 22 provides a time delay of n clock periods to the delayed multiple clock DCKFP1 to output the delayed multiple clock DCKFP2.

The time delays of the variable delay lines 21 and 22 are controlled by the control voltage Vb. The control voltage Vb provided by the DLL shown in FIGS. 13, 18 and 20 may be used as the control voltage Vb of the twelfth preferred embodiment. Alternatively, the control voltage Vb provided by the system PLL circuit 10 of the eighth preferred embodiment shown in FIG. 20 may be employed.

A majority circuit 23 receives the multiple clock CKFP, and the delayed multiple clocks DCKFP1 and DCKFP2 to output the recovered clock RCK whose level is one of the high and low levels of the three signals which has a majority.

Figure 30:
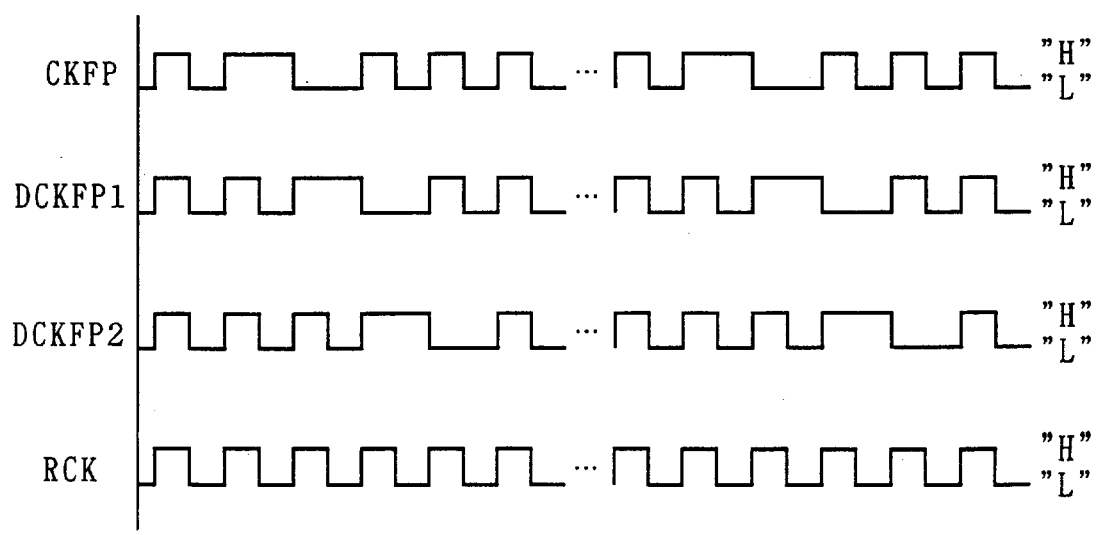
FIG. 30 is a timing chart showing the operation of the clock recovery circuit of FIG. 29.

Referring to FIG. 30, for example, when the delayed multiple clock DCKFP1 lags one clock period behind the multiple clock CKFP and the delayed multiple clock DCKFP2 lags one clock period behind the delayed multiple clock CKFP1, the doubled clock rates of the respective signals are corrected to a normal clock rate, and the correct recovered clock RCK is provided.

When the frequency of the multiple clock CKFP is K times (K>0) the frequency of the clock for the phase comparison in the DLL, the number of delay element stages of the variable delay lines 21 and 22 should be 1/K the number of variable delay element stages to be controlled by the DLL or the number of delay element stages of the VCO in the system PLL.

If the control input terminals of the variable delay lines 21 and 22 do not receive a bias voltage but a bias current, two current mirror circuits should be used to supply the bias current to the variable delay lines 21 and 22.

In this manner, the clock recovery circuit 47 of the twelfth preferred embodiment may be implemented only by substituting the two variable delay lines 21 and 22 and the majority circuit 23 for the variable delay line 7 and the OR gate G5 of the clock recovery circuit of FIG. 13, thereby correctly reproducing the multiple clock having a better DC balance and a better transmission characteristic.

While the invention has been described in detail, the foregoing description is in all aspects illustrative and not restrictive. It is understood that numerous other modifications and variations can be devised without departing from the scope of the invention.

We claim:

1. A digital data transmission system for transmitting digital data in a frame synchronization manner, said digital data transmission system comprising a transmitting portion for transmitting digital data, and a receiving portion for receiving said digital data, said transmitting portion comprising
a clock multiplexing circuit for multiplexing a frame pulse signal for frame synchronization with a clock having a predetermined period to output a multiple clock to said receiving portion, said receiving portion comprising
a clock recovery circuit for reproducing said clock from said multiple clock to provide a recovered clock by using a synchronization loop circuit for synchronizing a reference signal associated with said multiple clock and a comparison output signal, and
a frame pulse signal separation circuit for separating said frame pulse signal from said multiple clock to provide a recovered frame pulse signal by using said recovered clock.

2. The digital data transmission system according to claim 1, wherein said clock multiplexing circuit includes
clock shaping means receiving said clock and said frame pulse signal, said clock shaping means for performing a shaping process of masking said clock at a fixed value at least for said predetermined period during a time said frame pulse signal is active, said clock shaping means for outputting said clock intactly as said multiple clock for other time periods.

3. The digital data transmission system according to claim 2, wherein said clock shaping means further receives an enable signal and includes
enabling means for disabling said shaping process to force said clock to be outputted intactly as said multiple clock when said enable signal is inactive.

4. The digital data transmission system according to claim 2, wherein said clock recovery circuit includes:
phase comparing means for making a comparison between the phase of said multiple clock and the phase of a delayed multiple clock,
control signal output means for outputting a control signal on the basis of a result of the phase comparison of said phase comparing means, and
variable delay means for providing a time delay of n times said predetermined period (where n is a natural number) to said multiple clock on the basis of said control signal to output said delayed multiple clock,
said phase comparing means, said control signal output means, and said variable delay means constituting a DLL circuit for performing a delay synchronization process on said multiple clock and said delayed multiple clock,
said synchronization loop circuit including said DLL circuit, said reference signal including said multiple clock,
said comparison output signal including said delayed multiple clock, and
wherein said clock recovery circuit further includes logical OR means for ORing said multiple clock and said delayed multiple clock to output said recovered clock.

5. The digital data transmission system according to claim 2,
wherein said clock recovery circuit includes:
phase comparing means for making a comparison between the phase of a system clock and the phase of an oscillation signal,
control signal output means for outputting a control signal on the basis of a result of the phase comparison of said phase comparing means,
oscillating means for generating said oscillation signal at an oscillation frequency based on said control signal, and
variable delay means for providing a time delay of said predetermined period to said multiple clock on the basis of said control signal to output a delayed multiple clock,
said phase comparing means, said control signal output means, and said oscillating means constituting a PLL circuit for performing a phase synchronization process on said system clock and said oscillation signal,
said synchronization loop circuit including said PLL circuit,
said reference signal including said system clock,
said comparison output signal including said oscillation signal, and
wherein said clock recovery circuit further includes logical OR means for ORing said multiple clock and said delayed multiple clock to output said recovered clock.

6. The digital data transmission system according to claim 2,
wherein said clock recovery circuit includes:
phase comparing means for making a comparison between the phase of a comparison clock and the phase of said recovered clock,
control signal output means for outputting a control signal on the basis of a result of the phase comparison of said phase comparing means,
oscillating means for generating said recovered clock at an oscillation frequency based on said control signal, and
variable delay means for providing a time delay of said predetermined period to said multiple clock on the basis of said control signal to output a delayed multiple clock,
said phase comparing means, said control signal output means, and said oscillating means constituting a PLL circuit for performing a phase synchronization process on said comparison clock and said recovered clock,
said synchronization loop circuit including said PLL circuit,
said reference signal including said comparison clock,
said comparison output signal including said recovered clock, and
wherein said clock recovery circuit further includes logical OR means for ORing said multiple clock and said delayed multiple clock to output said comparison clock.

7. The digital data transmission system according to claim 6,
wherein said oscillating means includes a predetermined number of oscillating delay elements connected in a loop and having respective time delays controlled by said control signal,
wherein said variable delay means includes a predetermined number of variable delay elements connected in series and having respective time delays controlled by said control signal, the number of variable delay elements being equal to the number of said oscillating delay elements, and
wherein the time delays of said predetermined number of oscillating delay elements based on said control signal are equal to the time delays of said predetermined number of variable delay elements based on said control signal.

8. The digital data transmission system according to claim 2,
wherein said frame pulse signal separation circuit includes
fixed value detecting means for detecting whether or not said multiple clock maintains said fixed value for said predetermined period to output said recovered frame pulse signal which is active when said multiple clock maintains said fixed value for said predetermined period and is inactive otherwise.

9. The digital data transmission system according to claim 2,
wherein said clock recovery circuit includes:
phase comparing means for making a comparison between the phase of said multiple clock and the phase of said recovered clock,
control signal output means for outputting a control signal on the basis of a result of the phase comparison of said phase comparing means, and
oscillating means for generating said recovered clock at an oscillation frequency based on said control signal,
said phase comparing means, said control signal output means, and said oscillating means constituting a PLL circuit for performing a phase synchronization process on said multiple clock and said recovered clock,
said synchronization loop circuit including said PLL circuit,
said reference signal including said multiple clock,
said comparison output signal including said recovered clock.

10. The digital data transmission system according to claim 9,
wherein said clock recovery circuit further includes masking means receiving said recovered frame pulse signal, said masking means for disabling said phase synchronization when said recovered frame pulse signal indicates an active state.

11. The digital data transmission system according to claim 9,
wherein said clock recovery circuit further includes synchronization detecting means for detecting whether or not said multiple clock and said recovered clock is in synchronism with each other to disable said phase synchronization process upon detection of synchronization.

12. The digital data transmission system according to claim 1,
wherein said clock multiplexing circuit includes
clock shaping means receiving said clock and said frame pulse signal, said clock shaping means for performing a shaping process of doubling said predetermined period of said clock to output said multiple clock during the time said frame pulse signal is active.

13. The digital data transmission system according to claim 12,
wherein said clock recovery circuit includes:
phase comparing means receiving the earliest and second earliest ones of said multiple clock, a first delayed multiple clock, and a second delayed multiple clock respectively as first and second comparison signals for making a comparison between the phases of said first and second comparison signals,
control signal output means for outputting a control signal on the basis of a result of the phase comparison of said phase comparing means,
first variable delay means for providing a time delay of n times said predetermined period (where n is a natural number) to said multiple clock on the basis of said control signal to output said first delayed multiple clock, and
second variable delay means for providing a time delay of n times said predetermined period to said first delayed multiple clock on the basis of said control signal to output said second delayed multiple clock,
said phase comparing means, said control signal output means, and at least one of said first and second variable delay means constituting a DLL circuit for performing a delay synchronization process on said first and second comparison signals,
said synchronization loop circuit including said DLL circuit,
said reference signal including said first comparison signal,
said comparison output signal including said second comparison signal, and
wherein said clock recovery circuit further includes majority means for selecting a logic level of said recovered clock among three logic levels which said multiple clock, said first delayed multiple clock, and said second delayed multiple clock indicate, respectively, based on majority rule to output said recovered clock.

14. The digital data transmission system according to claim 12,
wherein said clock recovery circuit includes:
phase comparing means for making a comparison between the phase of a system clock and the phase of an oscillation signal,
control signal output means for outputting a control signal on the basis of a result of the phase comparison of said phase comparing means,
oscillating means for generating said oscillation signal at an oscillation frequency based on said control signal,
first variable delay means for providing a time delay of said predetermined period to said multiple clock on the basis of said control signal to output a first delayed multiple clock, and
second variable delay means for providing a time delay of said predetermined period to said first delayed multiple clock on the basis of said control signal to output a second delayed multiple clock,
said phase comparing means, said control signal output means, and said oscillating means constituting a PLL circuit for performing a phase synchronization process on said system clock and said oscillation signal,
said synchronization loop circuit including said PLL circuit,
said reference signal including said system clock,
said comparison output signal including said oscillation signal, and
wherein said clock recovery circuit further includes majority means for selecting a logic level of said recovered clock among three logic levels which said multiple clock, said first delayed multiple clock, and said second delayed multiple clock indicate, respectively, based on majority rule to output said recovered clock.

15. A digital data transmission system for transmitting digital data in a frame synchronization manner, said digital data transmission system comprising first to Nth transmitting portions for transmitting digital data, and a receiving portion for receiving said digital data,
said first to Nth transmitting portions comprising clock multiplexing circuits, respectively, for multiplexing first to Nth frame pulse signals for frame synchronization with first to Nth clocks having first to Nth periods to output first to Nth multiple clocks to said receiving portion,
said receiving portion comprising:
a clock recovery circuit for reproducing said first to Nth clocks from said first to Nth multiple clocks to provide first to Nth recovered clocks respectively by using a synchronization loop circuit for synchronizing a reference signal associated with said first multiple clock and a comparison output signal, and
first to Nth frame pulse signal separation circuits for separating said first to Nth frame pulse signals from said first to Nth multiple clocks to provide first to Nth recovered frame pulse signals by using said first to Nth recovered clocks, respectively.

16. The digital data transmission system according to claim 15,
wherein said clock recovery circuit has a synchronization detection function of detecting whether or not said synchronization loop circuit has synchronized said reference signal and said comparison output signal to output to said first transmitting portion a synchronization detection signal indicating whether said synchronization loop circuit is in a locked state in which said reference signal and said comparison output signal are synchronized or in an unlocked state in which said reference signal and said comparison output signal are not synchronized, and
wherein said clock multiplexing circuit of said first transmitting portion receives said synchronization detection signal, and has an enabling function of forcing said first clock to be outputted intactly as said first multiple clock when said synchronization detection signal indicates said unlocked state and of multiplexing said first frame pulse signal with said first clock to output said first multiple clock when said synchronization detection signal indicates said locked state.

17. The digital data transmission system according to claim 15,
wherein said clock recovery circuit includes:
phase comparing means for making a comparison between the phase of said first multiple clock and the phase of a first delayed multiple clock,
control signal output means for outputting a control signal on the basis of a result of the phase comparison of said phase comparing means,
first to Nth variable delay means for providing time delays of n times said first to Nth periods (where n is a natural number) to said first to Nth multiple clocks commonly on the basis of said control signal to output first to Nth delayed multiple clocks respectively, and first to Nth logical OR means for ORing said first to Nth multiple clocks and said first to Nth delayed multiple clocks to output said first to Nth recovered clocks respectively, said phase comparing means, said control signal output means, and said first variable delay means constituting a DLL circuit for performing a delay synchronization process on said first multiple clock and said first delayed multiple clock, said synchronization loop circuit including said DLL circuit, said reference signal including said first multiple clock, said comparison output signal including said first delayed multiple clock.

18. The digital data transmission system according to claim 15, wherein said clock recovery circuit includes:

phase comparing means for making a comparison between the phase of a system clock and the phase of an oscillation signal, control signal output means for outputting a control signal on the basis of a result of the phase comparison of said phase comparing means, oscillating means for generating said oscillation signal at an oscillation frequency based on said control signal, first to Nth variable delay means for providing time delays of said first to Nth periods to said first to Nth multiple clocks commonly on the basis of said control signal to output first to Nth delayed multiple clocks respectively, and first to Nth logical OR means for ORing said first to Nth multiple clocks and said first to Nth delayed multiple clocks to output said first to Nth recovered clocks respectively, said phase comparing means, said control signal output means, and said oscillating means constituting a PLL circuit for performing a phase synchronization process on said system clock and said oscillation signal, said synchronization loop circuit including said PLL circuit, said reference signal including said system clock, said comparison output signal including said oscillation signal.

19. The digital data transmission system according to claim 15, wherein said ith frame pulse signal separation circuit (i=1 to N) includes fixed value detecting means for detecting whether or not said ith multiple clock maintains a fixed value for said ith period to output said ith recovered frame pulse signal which is active when said ith multiple clock maintains said fixed value for said ith period and is inactive otherwise.

20. A digital data transmission system for transmitting digital data in a frame synchronization manner, said digital data transmission system comprising first and second transmitting and receiving portions for transmitting digital data and for receiving digital data, said first transmitting and receiving portion comprising a first clock multiplexing circuit for multiplexing a first frame pulse signal for frame synchronization with a first clock having a predetermined period to output a first multiple clock to said second transmitting and receiving portion, said second transmitting and receiving portion comprising a second clock multiplexing circuit for multiplexing a second frame pulse signal for frame synchronization with a second clock having said predetermined period to output a second multiple clock to said first transmitting and receiving portion, said first transmitting and receiving portion further comprising:

a first clock recovery circuit for reproducing said second clock as a first recovered clock from said second multiple clock to provide said first recovered clock by using a first synchronization loop circuit for synchronizing a first reference signal associated with said second multiple clock and a first comparison output signal, said first clock recovery circuit having a synchronization detection function of detecting whether or not said first reference signal and said first comparison output signal have been synchronized to output a first synchronization detection signal indicating whether said first synchronization loop circuit is in a locked state in which said first reference signal and said first comparison output signal are synchronized or in an unlocked state in which said first reference signal and said first comparison output signal are not synchronized, and a first frame pulse signal separation circuit for separating said second frame pulse signal as a first recovered frame pulse signal from said second multiple clock to provide said first recovered frame pulse signal by using said first recovered clock, said second transmitting and receiving portion further comprising:

a second clock recovery circuit for reproducing said first clock as a second recovered clock from said first multiple clock to provide said second recovered clock by using a second synchronization loop circuit for synchronizing a second reference signal associated with said first multiple clock and a second comparison output signal, said second clock recovery circuit having a synchronization detection function of detecting whether or not said second reference signal and said second comparison output signal have been synchronized to output a second synchronization detection signal indicating whether said second synchronization loop circuit is in a locked state in which said second reference signal and said second comparison output signal are synchronized or in an unlocked state in which said second reference signal and said second comparison output signal are not synchronized, and a second frame pulse signal separation circuit for separating said first frame pulse signal as a second recovered frame pulse signal from said first multiple clock to provide said second recovered frame pulse signal by using said second recovered clock, wherein said first clock multiplexing circuit of said first transmitting and receiving portion receives said first synchronization detection signal, and has an enabling function of forcing said first clock to be outputted intactly as said first multiple clock when said first synchronization detection signal indicates said unlocked state and of multiplexing said first frame pulse signal with said first clock to output said first multiple clock when said first synchronization detection signal indicates said locked state, and wherein said second clock multiplexing circuit of said second transmitting and receiving portion receives said second synchronization detection signal, and has an enabling function of forcing said second clock to be outputted intactly as said second multiple clock when said second synchronization detection signal indicates said unlocked state and of multiplexing said second frame pulse signal with said second clock to output said second multiple clock when said second synchronization detection signal indicates said locked state.

21. A transmission circuit for transmitting digital data to a reception circuit through a first transmission line, comprising:
a clock multiplexing circuit receiving a clock and a frame pulse signal for frame synchronization for multiplexing the frame pulse signal with the clock to output a multiple clock to the reception circuit through a second transmission line different from the first transmission line, wherein said clock multiplexing circuit receives an enable signal, said clock multiplexing circuit outputting the clock intactly as the multiple signal when the enable signal is in a first state and multiplexing the frame pulse signal with the clock when the enable signal is in a second state.

22. The transmission circuit according to claim 21, wherein
said clock multiplexing circuit includes a clock shaping circuit for masking the clock at a fixed level value for at least one cycle of the clock in response to the frame pulse signal.

23. The transmission circuit according to claim 22, wherein said clock shaping circuit includes a two-input logical gate circuit receiving the clock and the frame pulse signal.

24. The transmission circuit according to claim 22, wherein said clock shaping circuit doubling a cycle of the clock.

25. The transmission circuit according to claim 21, wherein said clock multiplexing circuit including a clock shaping circuit for varying a cycle of the clock in response to said frame signal.

26. A reception circuit receiving digital data from a transmission circuit, comprising:
a clock recovery circuit receiving a multiple clock for reproducing a recovered clock from the multiple clock, wherein said clock recovery circuit includes a synchronization loop circuit for generating the recovered clock; and
a frame pulse signal separation circuit receiving the multiple clock, for separating a frame pulse signal for frame synchronization from the multiple clock using the clock output from said clock recovery circuit,
wherein said clock recovery circuit includes:
phase comparing means for making a comparison between the phase of said multiple clock and the phase of a delayed multiple clock,
control signal output means for outputting a control signal on the basis of a result of the phase comparison of said phase comparing means, and
variable delay means for providing a time delay of n times said predetermined period (wherein n is a natural number) to said multiple clock on the basis of said control signal to output said delayed multiple clock,
said phase comparing means, said control signal output means, and said variable delay means constituting a DLL circuit for performing a delay synchronization process on said multiple clock and said delayed multiple clock,
said synchronization loop circuit including said DLL circuit, and
wherein said clock recovery circuit further includes logical OR means for ORing said multiple clock and said delayed multiple clock to output said recovered clock.

27. A reception circuit receiving digital data from a transmission circuit, comprising:
a clock recovery circuit receiving a multiple clock for reproducing a recovered clock from the multiple clock; and
a frame pulse signal separation circuit receiving the multiple clock, for separating a frame pulse signal for frame synchronization from the multiple clock using the clock output from said clock recovery circuit,
wherein said frame pulse signal separation circuit includes
fixed value detecting means for detecting whether or not said multiple clock maintains a fixed value for said predetermined period to output said recovered frame pulse signal which is active when said multiple clock maintains said fixed value for said predetermined period and is inactive otherwise.

28. A reception circuit receiving digital data from a transmission circuit, comprising:
a clock recovery circuit receiving a multiple clock for reproducing a recovered clock from the multiple clock, wherein said clock recovery circuit includes a synchronization loop circuit for generating the recovered clock; and
a frame pulse signal separation circuit receiving the multiple clock, for separating a frame pulse signal for frame synchronization from the multiple clock using the clock output from said clock recovery circuit,
wherein said clock recovery circuit includes:
phase comparing means receiving the earliest and second earliest ones of said multiple clock, a first delayed multiple clock, and a second delayed multiple clock respectively as first and second comparison signals for making a comparison between the phases of said first and second comparison signals,
control signal output means for outputting a control signal on the basis of a result of the phase comparison of said phase comparing means,
first variable delay means for providing a time delay of n times said predetermined period (where n is a natural number) to said multiple clock on the basis of said control signal to output said first delayed multiple clock, and
second variable delay means for providing a time delay of n times said predetermined period to said first delayed multiple clock on the basis of said control signal to output said second delayed multiple clock,
said phase comparing means, said control signal output means, and at least one of said first and second variable delay means constituting a DLL circuit for performing a delay synchronization process on said first and second comparison signals,
said comparison output signal including said second comparison signal, and
wherein said clock recovery circuit further includes majority means for selecting a logic level of said recovered clock among three logic levels which said multiple clock, said first delayed multiple clock, and said second delayed multiple clock indicates, respectively, based on majority rule to output said recovered clock.

29. A reception circuit receiving digital data from a transmission circuit, comprising:

a clock recovery circuit receiving a multiple clock for reproducing a recovered clock from the multiple clock, wherein said clock recovery circuit includes a synchronization loop circuit for generating the recovered clock; and a frame pulse signal separation circuit receiving the multiple clock, for separating a frame pulse signal for frame synchronization from the multiple clock using the clock output from said clock recovery circuit, wherein said clock recovery circuit includes:

phase comparing means for making a comparison between the phase of a system clock and the phase of an oscillation signal, control signal output means for outputting a control signal on the basis of a result of the phase comparison of said phase comparing means, oscillating means for generating said oscillation signal at an oscillation frequency based on said control signal, first variable delay means for providing a time delay of said predetermined period to said multiple clock on the basis of said control signal to output a first delayed multiple clock, and second variable delay means for providing a time delay of said predetermined period to said first delayed multiple clock on the basis of said control signal to output a second delayed multiple clock, said phase comparing means, said control signal output means, and said oscillating means constituting a PLL circuit for performing a phase synchronization process on said system clock and said oscillation signal, said synchronization loop circuit including said PLL circuit, and wherein said clock recovery circuit further includes majority means for selecting a logic level of said recovered clock among three logic levels which said multiple clock, said first delayed multiple clock, and said second delayed multiple clock indicate, respectively, based on majority rule to output said recovered clock.

30. A transmission circuit for transmitting digital data to a reception circuit through a first transmission line, comprising:

a clock multiplexing circuit receiving a clock and a frame pulse signal for frame synchronization for multiplexing the frame pulse signal with the clock to output a multiple clock to the reception circuit through a second transmission line different from the first transmission line, said clock multiplexing circuit including:

a latch receiving the frame pulse signal and the clock, and delaying said frame pulse signal by half a clock cycle of the clock to a output a delayed frame pulse signal; and a two-input logic gate circuit receiving the delayed frame pulse signal and the clock signal and outputting the multiple clock.

31. A transmission circuit for transmitting digital data to a reception circuit through a first transmission line, comprising:

a clock multiplexing circuit receiving a clock and a frame pulse signal for frame synchronization for multiplexing the frame pulse signal with the clock to output a multiple clock to the reception circuit through a second transmission line different from the first transmission line, said clock multiplexing circuit including:

a first latch receiving the frame pulse signal and the clock, and delaying said frame pulse signal by half a clock cycle of the clock to output a first delayed frame pulse signal;

a second latch receiving the first delayed frame pulse signal and the clock, and delaying said first delayed frame pulse signal by half a clock cycle of the clock to output a second delayed frame pulse signal; and a selector receiving said first and second delayed pulse signals, and selecting one of said first and second delayed pulse signals in response to the clock to output the multiple clock.

* * * * *